(12) United States Patent
Fernandes Barros

(10) Patent No.: US 9,641,126 B2
(45) Date of Patent: May 2, 2017

(54) SYSTEMS AND METHODS FOR I-Q IMBALANCE CALIBRATION

(71) Applicant: QUALCOMM Incorporated, San Diego, CA (US)

(72) Inventor: Daniel Jose Fernandes Barros, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/134,813

(22) Filed: Dec. 19, 2013

(65) Prior Publication Data
US 2015/0180415 A1    Jun. 25, 2015

(51) Int. Cl.
| | |
|---|---|
| H04B 1/38 | (2015.01) |
| H03D 3/00 | (2006.01) |
| H04B 7/0413 | (2017.01) |
| H04L 27/00 | (2006.01) |
| H04B 17/14 | (2015.01) |
| H04B 17/21 | (2015.01) |
| H04L 27/36 | (2006.01) |
| H04L 27/38 | (2006.01) |

(52) U.S. Cl.
CPC ............... *H03D 3/009* (2013.01); *H04B 1/38* (2013.01); *H04B 7/0413* (2013.01); *H04B 17/14* (2015.01); *H04B 17/21* (2015.01); *H04L 27/0014* (2013.01); *H04L 27/368* (2013.01); *H04L 27/3863* (2013.01); *H04L 2027/0067* (2013.01)

(58) Field of Classification Search
CPC . H04L 27/364; H04L 27/3854; H04L 55/143; H04B 1/62; H04B 1/38

USPC ....................................... 375/219, 226, 267
See application file for complete search history.

(56) References Cited

U.S. PATENT DOCUMENTS

| | | | | |
|---|---|---|---|---|
| 5,852,630 | A * | 12/1998 | Langberg et al. ............ 375/219 |
| 8,295,845 | B1 * | 10/2012 | Abdollahi-Alibeik . H04B 17/14 |
| | | | | 455/226.1 |
| 2002/0006171 | A1 * | 1/2002 | Nielsen .................. H03D 7/163 |
| | | | | 375/316 |
| 2005/0075815 | A1 * | 4/2005 | Webster et al. ............... 702/106 |
| 2006/0223558 | A1 * | 10/2006 | Behzad ................ H04B 1/0082 |
| | | | | 455/502 |
| 2007/0025474 | A1 * | 2/2007 | Moorti et al. ................ 375/329 |
| 2010/0067622 | A1 * | 3/2010 | Komaili et al. .............. 375/345 |
| 2010/0232493 | A1 * | 9/2010 | Thirumoorthy .............. 375/232 |
| 2011/0069767 | A1 | 3/2011 | Zhu |
| 2011/0207418 | A1 * | 8/2011 | Laroia et al. ................... 455/75 |
| 2011/0292978 | A1 | 12/2011 | Kravitz |
| 2012/0230372 | A1 | 9/2012 | Park et al. |

(Continued)

OTHER PUBLICATIONS

Lai J,W., et al., "A World-Band Triple-Mode 802.11a/B/G Soc in 130-Nm CMOS," IEEE Journal of Solid-State Circuits, Nov. 2009, pp. 2911-2921, vol. 44 (11).

(Continued)

*Primary Examiner* — Helene Tayong
(74) *Attorney, Agent, or Firm* — Austin Rapp & Hardman

(57) ABSTRACT

A method for in-phase-quadrature (I-Q) imbalance calibration is described. A signal is transmitted by a first transmitter in a first system. The signal includes a constant value. The signal is received at a second receiver in a second system. An I-Q imbalance is estimated for the second receiver based on the received signal.

23 Claims, 13 Drawing Sheets

(56) References Cited

U.S. PATENT DOCUMENTS

| | | | |
|---|---|---|---|
| 2012/0263215 A1* | 10/2012 | Peng | H04B 1/0475 375/221 |
| 2012/0300818 A1* | 11/2012 | Metreaud | H04B 1/30 375/219 |
| 2013/0039444 A1 | 2/2013 | Porret et al. | |
| 2013/0101012 A1 | 4/2013 | Toosi et al. | |
| 2014/0140379 A1* | 5/2014 | Teplitsky | H04L 27/364 375/219 |

OTHER PUBLICATIONS

International Search Report and Written Opinion—PCT/US2014/069950—ISA/EPO—Mar. 19, 2015.

* cited by examiner

SYSTEMS AND METHODS FOR I-Q IMBALANCE CALIBRATION

TECHNICAL FIELD

The present disclosure relates generally to wireless communication systems. More specifically, the present disclosure relates to systems and methods for in-phase-quadrature (I-Q) imbalance calibration.

BACKGROUND

Wireless communication systems are widely deployed to provide various types of communication content such as voice, video, data and so on. These systems may be multiple-access systems capable of supporting simultaneous communication of multiple mobile devices with one or more base stations.

A wireless communication device may include one or more transmitters and receivers to support bi-directional communication. A transmitter may condition and upconvert in-phase (I) and quadrature (Q) output baseband signals to obtain an output radio frequency (RF) signal that is more suitable for transmission via a wireless channel. The receiver may receive an input RF signal via the wireless channel and may downconvert the input RF signal to obtain in-phase (I) and quadrature (Q) input baseband signals.

The transmitter and receiver may each include separate branches for the in-phase (I) and quadrature (Q) signals. Ideally, the I branch and the Q branch have equal gain with a 90 phase difference from each other. However, imbalances may exist between the I branch and the Q branch. These imbalances may degrade the performance of the transmitter and the receiver. Benefits may be realized by improvements to I-Q imbalance calibration.

SUMMARY

A method for in-phase-quadrature (I-Q) imbalance calibration is described. A signal is transmitted by a first transmitter in a first system. The signal includes a constant value. The signal is received at a second receiver in a second system. An I-Q imbalance is estimated for the second receiver based on the received signal.

Estimating the I-Q imbalance may include measuring power on an in-phase branch and a quadrature branch. Estimating the I-Q imbalance may also include measuring a cross-correlation between the in-phase branch and the quadrature branch.

Estimating the I-Q imbalance may further include determining a gain imbalance of the second receiver based on the power on the in-phase branch and the power on the quadrature branch. Estimating the I-Q imbalance may additionally include determining a phase imbalance of the second receiver based on the cross-correlation between the in-phase branch and the quadrature branch and the power on the in-phase branch.

A first synthesizer in the first system may be set to a first frequency. A second synthesizer in the second system may be set to a second frequency. The first frequency and the second frequency may differ by a third frequency. The first frequency and the second frequency may be within a valid bandwidth range for the second receiver.

A digital tone may be transmitted by a second transmitter in the second system. The digital tone may be received at the second receiver in the second system. The I-Q imbalance for the second transmitter in the second system may be estimated based on the received digital tone.

The first system may be a WiFi system, a Bluetooth system, or a Long-Term Evolution system. The second system may be a WiFi system, a Bluetooth system, or a Long-Term Evolution system. The first system and the second system may be different types of wireless systems.

The signal may further include an in-phase component set to a first constant value and a quadrature component set to a second constant value. The first system and the second system may be on a combined system on chip.

A wireless communication device configured for I-Q imbalance calibration is also described. The wireless communication device includes a processor, memory in electronic communication with the processor and executable instructions stored in the memory. The instructions are executable to transmit a signal by a first transmitter in a first system. The signal includes a constant value. The instructions are also executable to receive the signal at a second receiver in a second system. The instructions are further executable to estimate an I-Q imbalance for the second receiver based on the received signal.

Another wireless communication device configured for I-Q imbalance calibration is also described. The wireless communication device includes means for transmitting a signal by a first transmitter in a first system. The signal includes a constant value. The wireless communication device also includes means for receiving the signal at a second receiver in a second system. The wireless communication device further includes means for estimating an I-Q imbalance for the second receiver based on the received signal.

A computer-program product for I-Q imbalance calibration is also described. The computer-program product includes a non-transitory computer-readable medium having instructions thereon. The instructions include code for causing a wireless communication device to transmit a signal by a first transmitter in a first system. The signal includes a constant value. The instructions also include code for causing the wireless communication device to receive the signal at a second receiver in a second system. The instructions further include code for causing the wireless communication device to estimate an I-Q imbalance for the second receiver based on the received signal.

DETAILED DESCRIPTION

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

Figure 1:
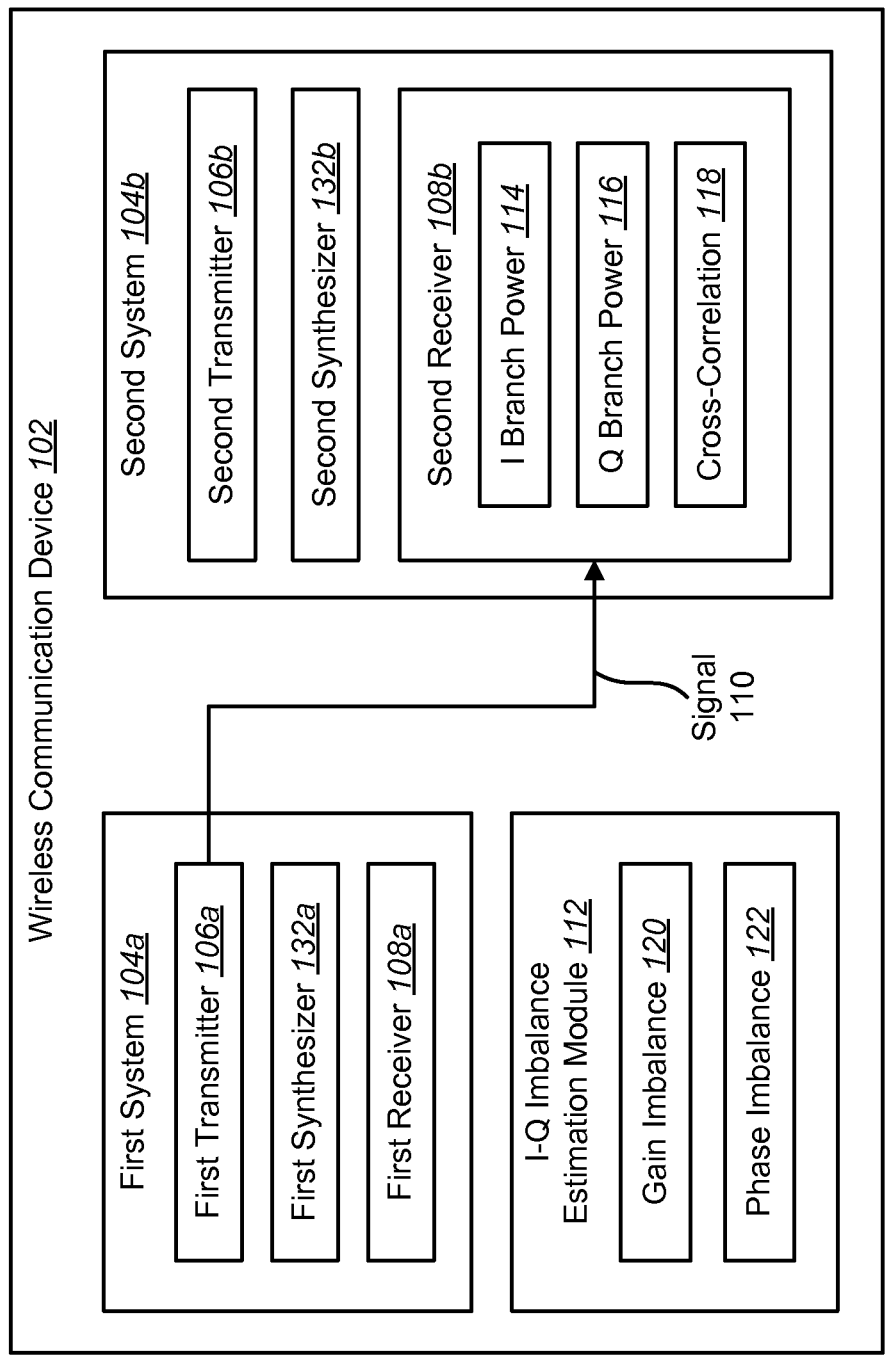
FIG. 1 shows a wireless communication device configured for I-Q imbalance calibration.

FIG. 1 shows a wireless communication device 102 configured for I-Q imbalance calibration. The wireless communication device 102 may operate in a wireless communication system. Wireless communication devices 102 are widely deployed to provide various types of communication content such as voice, data and so on.

Communications in a wireless communication system (e.g., a multiple-access system) may be achieved through transmissions over a wireless link. Such a communication link may be established via a single-input and single-output (SISO), multiple-input and single-output (MISO) or a multiple-input and multiple-output (MIMO) system. A MIMO system includes transmitter(s) and receiver(s) equipped, respectively, with multiple ($N_T$) transmit antennas and multiple ($N_R$) receive antennas for data transmission. SISO and MISO systems are particular instances of a MIMO system. The MIMO system can provide improved performance (e.g., higher throughput, greater capacity or improved reliability) if the additional dimensionalities created by the multiple transmit and receive antennas are utilized.

A wireless communication system may utilize MIMO. A MIMO system may support both time division duplex (TDD) and frequency division duplex (FDD) systems. In a TDD system, uplink and downlink transmissions are in the same frequency region so that the reciprocity principle allows the estimation of the downlink channel from the uplink channel. This enables a transmitting wireless device to extract transmit beamforming gain from communications received by the transmitting wireless device.

The wireless communication system may be a multiple-access system capable of supporting communication with multiple wireless communication devices 102 by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The terms "networks" and "systems" are often used interchangeably. A CDMA network may implement a radio technology such as Universal Terrestrial Radio Access (UTRA), cdma2000, etc. UTRA includes W-CDMA and Low Chip Rate (LCR) while cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDMA, etc. UTRA, E-UTRA and GSM are part of Universal Mobile Telecommunication System (UMTS). Long Term Evolution (LTE) is a release of UMTS that uses E-UTRA. UTRA, E-UTRA, GSM, UMTS and Long Term Evolution (LTE) are described in documents from an organization named "3rd Generation Partnership Project" (3GPP). cdma2000 is described in documents from an organization named "3rd Generation Partnership Project 2" (3GPP2).

The $3^{rd}$ Generation Partnership Project (3GPP) is a collaboration between groups of telecommunications associations that aims to define a globally applicable $3^{rd}$ generation (3G) mobile phone specification. 3GPP Long Term Evolution (LTE) is a 3GPP project aimed at improving the Universal Mobile Telecommunications System (UMTS) mobile phone standard. The 3GPP may define specifications for the next generation of mobile networks, mobile systems and mobile devices.

In 3GPP Long Term Evolution (LTE), a wireless communication device 102 may be referred to as a "user equipment" (UE). A wireless communication device 102 may also be referred to as, and may include some or all of the functionality of, a terminal, an access terminal, a subscriber unit, a station, etc. A wireless communication device 102 may be a cellular phone, a personal digital assistant (PDA), a wireless device, a wireless modem, a handheld device, a laptop computer, etc.

A wireless communication device 102 may communicate with zero, one or multiple base stations on a downlink and/or uplink at any given moment. The downlink (or forward link) refers to the communication link from a base station to a wireless communication device 102, and the uplink (or reverse link) refers to the communication link from a wireless communication device 102 to a base station.

The wireless communication device 102 may include two or more wireless systems 104. The wireless systems 104 may be different types of wireless systems. For example, a first system 104a may be a WiFi system and a second system 104b may be a Bluetooth (BT) system.

In one configuration, both wireless systems 104 may be included in a combined system on chip (SOC). An SOC is an integrated circuit that integrates multiple components of an electronic system into a single chip. Multiple wireless systems 104 may be included on a single SOC. For example, the SOC may include a WiFi system and a BT system. In another implementation, the SOC may include a WiFi system and an LTE system. In yet another implementation, the SOC may include a WiFi system, a BT system and an LTE system. It should be noted that additional wireless system types and combinations may be included in addition to those described herein. Combined SOCs may be cheaper, consume less power and may be optimized for concurrent operation.

The first system 104a may include a first transmitter 106a, a first receiver 108a, and a first synthesizer 132a. The second system 104b may include a second transmitter 106b, a second receiver 108b, and a second synthesizer 132b. A transmitter 106 may condition and upconvert I-Q output baseband signals with synthesizer signals to obtain an output radio frequency (RF) signal that is more suitable for transmission via a wireless channel. A receiver 108 may receive an input RF signal via the wireless channel. The receiver may downconvert the input RF signal with synthesizer signals to obtain I-Q baseband signals.

Each transmitter 106 may include an I branch to condition and upconvert the in-phase output baseband signal. The transmitters 106 may also include a Q branch to condition and upconvert the quadrature output baseband signal. Likewise, the receivers 108 may include an I branch to downconvert and condition the received in-phase signal and a Q branch to downconvert and condition the received quadrature signal. Ideally, the I branch may be 90 degrees out of phase with respect to the Q branch, with the branches having equal gain. However, an imbalance may exist between the I branch and the Q branch in transmitters 106 and receivers 108. An imbalance between the gains of the I branch and the Q branch (i.e., when the gains of the branches are not equal) is referred to as an I-Q amplitude imbalance. An imbalance between the phase of the I branch and the Q branch (i.e., when the phase difference between the I branch and the Q branch is different than 90 degrees) may be referred to as an I-Q phase imbalance.

The wireless systems 104 in a combined SOC chip typically operate independently for calibration routines. However, according to the systems and methods described herein, the wireless systems 104 in an SOC chip having two (or more) wireless systems 104 may cooperate for I-Q imbalance calibration. By using cooperative I-Q imbalance calibration, a wireless communication device 102 may not only achieve more accurate I-Q calibration, but may also reduce the time required for calibration by taking advantage of two independent synthesizers 132.

By utilizing two independent synthesizers 132, the transmitter I-Q imbalance may be decoupled from the receiver I-Q imbalance. It should be noted that this approach may be used in any combined SOC chip with two or more wireless systems 104 with independent synthesizers 132 that can overlap in frequency. In other words, if a frequency associated the first system 104a is within a valid bandwidth range for the second system 104b, then the first synthesizer 132a of the first system 104a may be used for I-Q imbalance calibration of the second system 104b. Similarly, if a frequency associated the second system 104b is within a valid bandwidth range for the first system 104a, then the second synthesizer 132b (associated with the second system 104b) may be used for I-Q imbalance calibration of the first system 104a.

To calibrate the I-Q imbalance for the second receiver 108b of the second system 104b, the first transmitter 106a may transmit a signal 110. The signal 110 may include a constant value. For example, the signal 110 may include a transmitted baseband in-phase component $x_I(t)$ set to a constant value ($k_1$). The signal 110 may also include a transmitted baseband quadrature component $x_Q(t)$ set to a constant value ($k_2$).

The first synthesizer 132a in the first system 104a may be set to a first frequency (e.g., $f_{synth1}=f_c+f_{IF}$). The second synthesizer 132b in the second system 104b may be set to a second frequency (e.g., $f_{synth2}=f_c$). It should be noted that the first frequency and the second frequency differ by a third frequency (e.g., $f_{IF}$). The in-phase component $x_I(t)$ and the quadrature component $x_Q(t)$ may be combined with in-phase and quadrature signals from the first synthesizer 132a to produce a combined signal 110.

The second receiver 108b in the second system 104b may receive the signal 110. The signal 110 may be received at the second receiver 108b via an I-Q calibration loopback path.

In one configuration, the I-Q calibration loopback path may include a switch that is operable to activate (e.g., close) I-Q calibration loopback path during I-Q imbalance calibration and deactivate (e.g., open) I-Q calibration loopback path after I-Q imbalance calibration.

The combined signal 110 may be mixed with an in-phase signal from the second synthesizer 132b to produce an in-phase baseband component ($s_I(t)$). The combined signal 110 may also be mixed with a quadrature signal from the second synthesizer 132b to produce a quadrature baseband component ($s_Q(t)$). The received signal 110 may be affected by a gain imbalance $\alpha_R$ 120 and a phase imbalance $\theta_R$ 122 of the second receiver 108b.

The wireless communication device 102 may include an I-Q imbalance estimation module 112. The I-Q imbalance estimation module 112 may estimate an I-Q imbalance for the second receiver 108b based on the received signal 110. In one configuration, the I-Q imbalance estimation module 112 may measure the I branch power 114 and the Q branch power 116 of the second receiver 108b. The I-Q imbalance estimation module 112 may also measure a cross-correlation 118 between the I branch and the Q branch of the second receiver 108b.

Upon measuring the I branch power 114, the Q branch power 116 and the cross-correlation 118 between the I branch and the Q branch of the second receiver 108b, the I-Q imbalance estimation module 112 may determine a gain imbalance 120 of the second receiver 108b based on the I branch power 114 and the Q branch power 116. The I-Q imbalance estimation module 112 may also determine a phase imbalance 122 of the second receiver 108b based on the cross-correlation 118 and the I branch power 114. Estimating the I-Q imbalance for the second receiver 108b is discussed in more detail in connection with FIG. 8 below. An example of an I-Q calibration module is discussed below in connection with FIG. 13.

Figure 2:
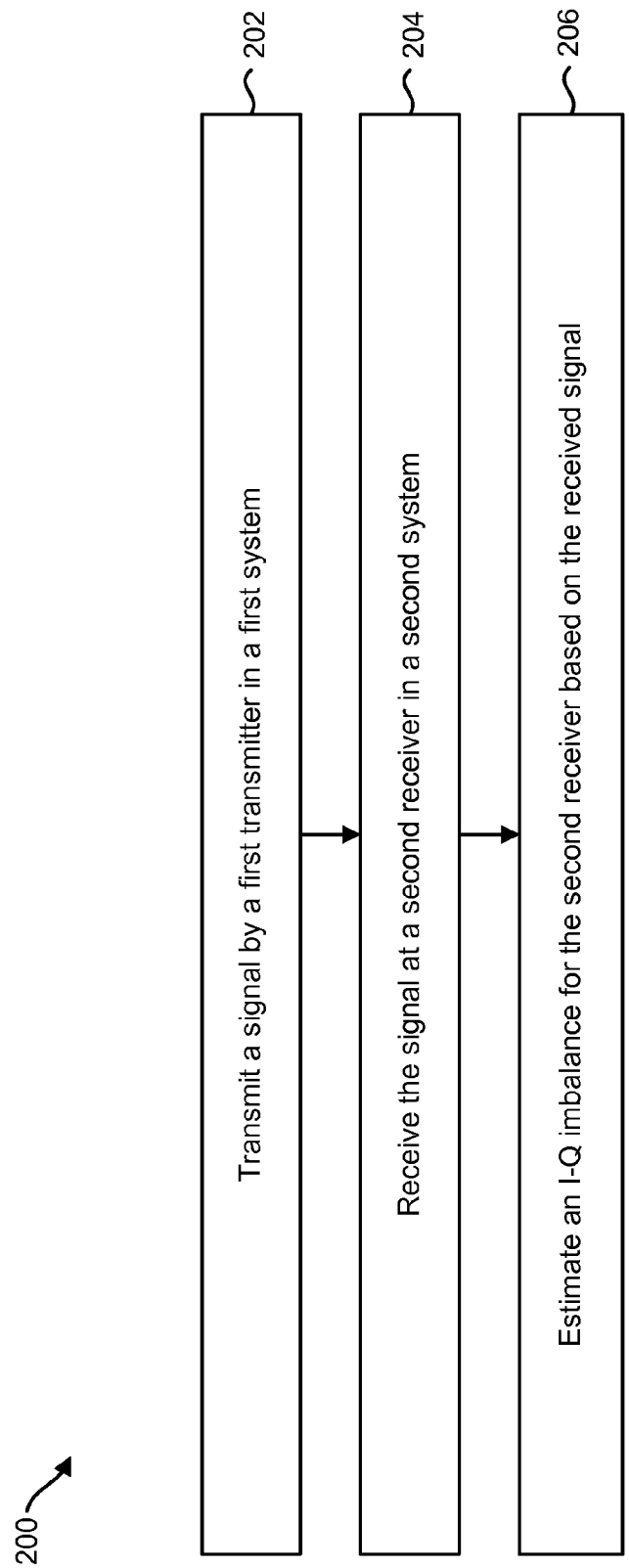
FIG. 2 is a flow diagram of a method for I-Q imbalance calibration.

FIG. 2 is a flow diagram of a method 200 for I-Q imbalance calibration. The method 200 may be performed by a wireless communication device 102 that includes a first system 104a and a second system 104b. The first system 104a and the second system 104b may be different types of wireless systems. For example, the first system 104a may be a WiFi system and the second system 104b may be a Bluetooth (BT) system. The first system 104a and the second system 104b may be on a single combined system on chip (SOC).

The wireless communication device 102 may transmit 202 a signal 110 by a first transmitter 106a in the first system 104a. The signal 110 may include a constant value. For example, the signal 110 may include a transmitted baseband in-phase component $x_I(t)$ set to a constant value ($k_1$). The signal 110 may also include a transmitted baseband quadrature component $x_Q(t)$ set to a constant value ($k_2$).

A first synthesizer 132a in the first system 104a may be set to a first frequency (e.g., $f_{synth1}=f_c+f_{IF}$). A second synthesizer 132b in the second system 104b may be set to a second frequency (e.g., $f_{synth2}=f_c$) Therefore, the first frequency and the second frequency differ by a third frequency (e.g., $f_{IF}$). The in-phase component $x_I(t)$ and the quadrature component $x_Q(t)$ may be combined with in-phase and quadrature signals from the first synthesizer 132a to produce a combined signal 110.

The wireless communication device 102 may receive 204 the signal 110 at a second receiver 108b in the second system 104b. The signal 110 may be received at the second receiver 108b via an I-Q calibration loopback path. In one configuration, the I-Q calibration loopback path may include a switch that is operable to activate (e.g., close) I-Q calibration loopback path during I-Q imbalance calibration and deactivate (e.g., open) I-Q calibration loopback path after I-Q imbalance calibration.

The combined signal 110 may be mixed with an in-phase signal from the second synthesizer 132b to produce an in-phase baseband component ($s_I(t)$). The combined signal 110 may also be mixed with a quadrature signal from the second synthesizer 132b to produce a quadrature baseband component ($s_Q(t)$). The received signal 110 may be affected by a gain imbalance $\alpha_R$ and the phase imbalance $\theta_R$ of the second receiver 108b.

The wireless communication device 102 may estimate 206 an I-Q imbalance for the second receiver 108b based on the received signal 110. The wireless communication device 102 may measure power on the I branch (e.g., the I branch power 114) and power on the Q branch (e.g., the Q branch power 116) of the second receiver 108b. The wireless communication device 102 may also measure a cross-correlation 118 between the I branch and the Q branch of the second receiver 108b.

Upon measuring the I branch power 114, the Q branch power 116 and the cross-correlation 118 between the I branch and the Q branch of the second receiver 108b, the wireless communication device 102 may determine a gain imbalance 120 of the second receiver 108b based on the I branch power 114 and the Q branch power 116. The wireless communication device 102 may also determine a phase imbalance 122 of the second receiver 108b based on the cross-correlation 118 and the I branch power 114.

Figure 3:
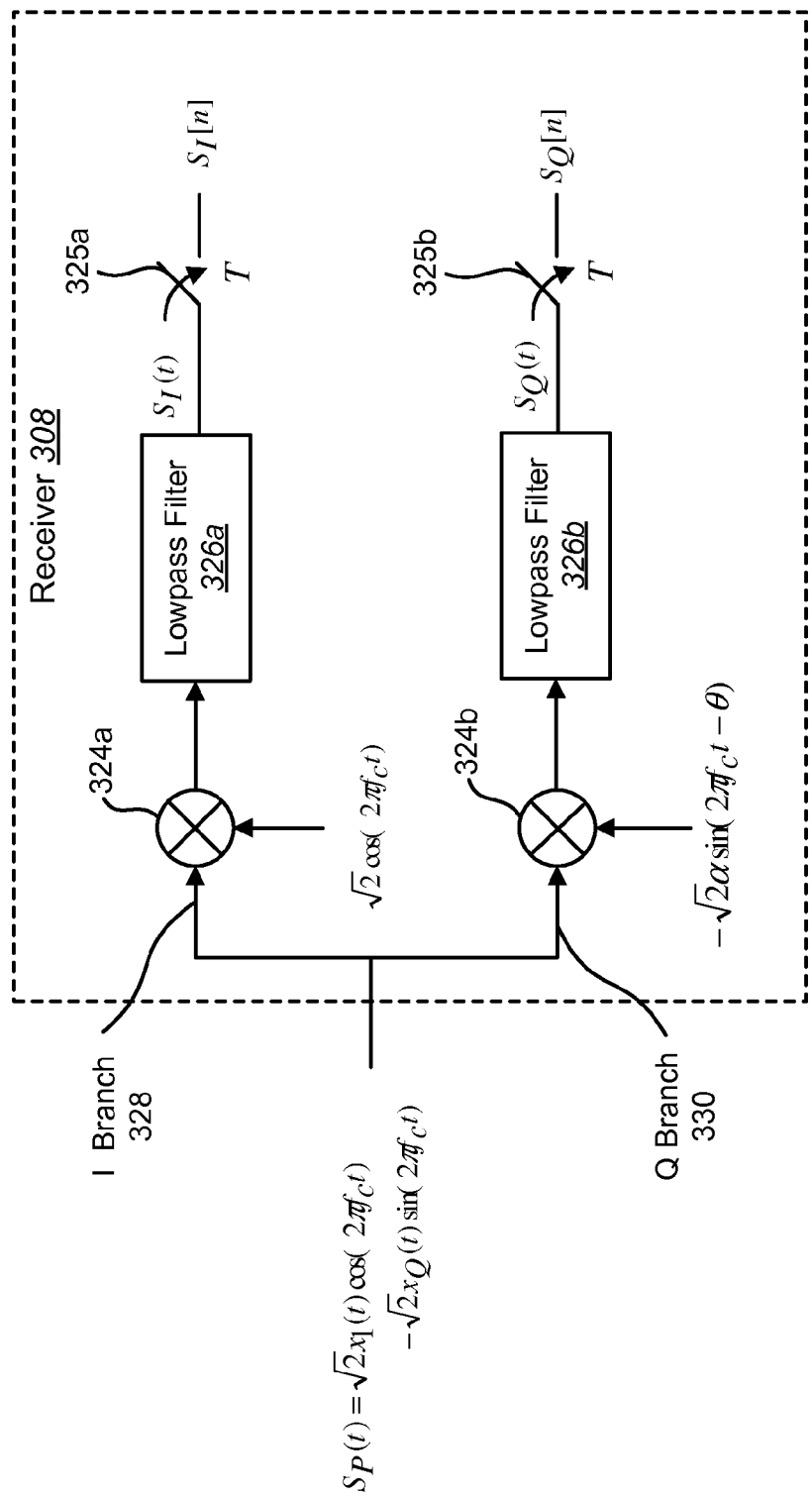
FIG. 3 is a block diagram illustrating a mathematical model of a receiver with I-Q imbalance.

FIG. 3 is a block diagram illustrating a mathematical model of a receiver 308 with I-Q imbalance. The receiver 308 may be part of a transceiver on a wireless device. The receiver 308 may receive a signal 110. The receiver 308 may include a mixer 324a for an in-phase (I) branch 328 and a mixer 324b for a quadrature (Q) branch 330. The mixer 324a for the I branch 328 may receive an in-phase signal ($\sqrt{2}\cos(2\pi f_c t)$) from a synthesizer 132 associated with the receiver 308, where $f_c$ is the carrier frequency. The mixer 324b for the Q branch 330 may receive a quadrature signal ($\sqrt{2}\sin(2\pi f_c t - \theta)$) from the synthesizer 132. A real modulated passband signal may be written according to Equation (1).

$$s_p(t) = \sqrt{2} x_I(t) \cos 2\pi f_c t - \sqrt{2} x_Q(t) \sin 2\pi f_c t \quad (1)$$

In Equation (1), $x_I(t)$ and $x_Q(t)$ are the modulated in-phase (I) and quadrature (Q) components of the signal 110. Alternatively, a real passband signal 110 may be represented using complex baseband analysis as given by Equation (2).

$$s_p(t) = \Re e\{\sqrt{2} s_{bb}(t) e^{j2\pi f_c t}\} \quad (2)$$

In Equation (2), $s_{bb}(t)$ is the equivalent complex baseband signal of $s_P(t)$ as provided by $$s_{bb}(t) = x_I(t) + j x_Q(t). \quad (3)$$

The front-end of a receiver 308 with a local oscillator (LO) (not shown) may have a gain imbalance ($\alpha_R$) 120 and a phase imbalance ($\theta_R$) 122. For simplicity, the I branch 328 may be a reference, and the Q branch 330 may include the gain imbalance 120 and the phase imbalance 122. The combined signal may be mixed with the in-phase signal from the synthesizer 132 in a mixer 324a and passed through a lowpass filter 326a to produce an in-phase component ($s_I(t)$). The combined signal may also be mixed with the quadrature signal in a mixer 324b and passed through a lowpass filter 326b to produce a quadrature component ($s_Q(t)$). The received in-phase component ($s_I(t)$) and quadrature component ($s_Q(t)$) in the presence of I-Q imbalance may be expressed according to Equation (4).

$$s_I(t) = x_I(t)$$

$$s_Q(t) = \alpha \sin(\theta) x_I(t) + \alpha \cos(\theta) x_Q(t) \quad (4)$$

Using a matrix model, the I-Q imbalance may alternatively be modeled as $$\begin{bmatrix} s_I(t) \\ s_Q(t) \end{bmatrix} = \begin{bmatrix} 1 & 0 \\ \alpha \sin(\theta) & \alpha \cos(\theta) \end{bmatrix} \begin{bmatrix} x_I(t) \\ x_Q(t) \end{bmatrix}. \quad (5)$$

It may be observed in Equation (5) that when there is no I-Q imbalance (e.g., $\alpha=1$ and $\theta=0$) the receiver correctly detects the desired in-phase and quadrature components, $x_I(t)$ and $x_Q(t)$, respectively. The in-phase component ($s_I(t)$) and the quadrature component ($s_Q(t)$) may be split in a splitter 325a,b. The splitter 325a,b may be a 3 dB splitter that splits the RF signal equally on the I branch and the Q branch. In FIG. 3, $s_I[n]$ and $s_Q[n]$ are the received baseband signals.

Figure 4:
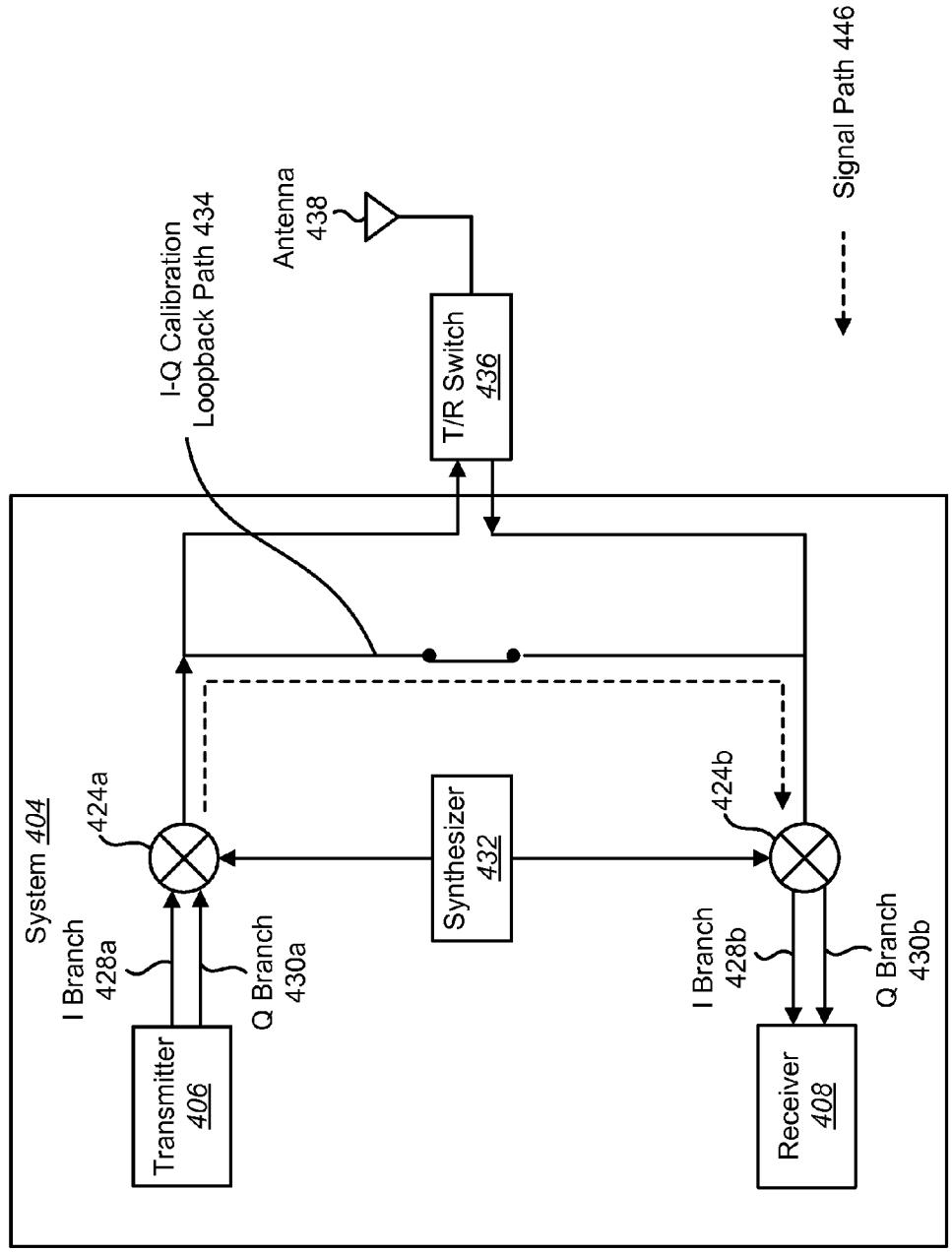
FIG. 4 is a block diagram illustrating one configuration for I-Q imbalance calibration for a single system.

FIG. 4 is a block diagram illustrating one configuration for I-Q imbalance calibration for a single system 404. A transmitter 406 (e.g., Tx modem) and a receiver 408 (e.g., Rx modem) may be included in a single system 404. For example, the system 404 may be a WiFi system, a Bluetooth (BT) system, or a Long-Term Evolution (LTE) system, etc. The system 404 may be coupled to a transmit/receive (T/R) switch 436 and an antenna 438 to transmit and receive wireless transmissions. In one configuration, the system 404 may be a standalone chip, which may also include a synthesizer 432.

For standalone chips, the I-Q calibration of the receiver 408 is typically done by transmitting a tone from the transmitter 406 and looping back the signal to the receiver 408 via an I-Q calibration loopback path 434, as illustrated by the signal path 446. The loopback path 434 is typically implemented before the T/R switch 436 that controls access to the antenna 438. In traditional I-Q imbalance calibration, the transmitter 406 may produce a tone that is looped back to the receiver 408. For example, the transmitter 406 may transmit a tone on an I branch 428a and a Q branch 430a that may be combined with in-phase and quadrature signals from a synthesizer 432 in a mixer 424a to produce a combined signal 110. The combined signal 110 may be received at a mixer 424b and separated into in-phase and quadrature components with in-phase and quadrature signals from the synthesizer 432. The in-phase component may be received on an I branch 428b and the quadrature component may be received on a Q branch 430b.

The calibration method illustrated in FIG. 4 has some disadvantages. The calibration tone needs to be generated digitally by the transmitter 406 since the synthesizer 432 is common to the receiver 408 and the transmitter 406. Because the transmitter 406 needs to generate a complex baseband tone for calibration, the received tone at the receiver 408 will be corrupted not only by the receiver I-Q imbalance but also by the transmitter I-Q imbalance. Therefore, calibration algorithms may try to perform a joint transmitter I-Q calibration and Rx I-Q calibration, as described below in connection with FIG. 6.

Figure 5:
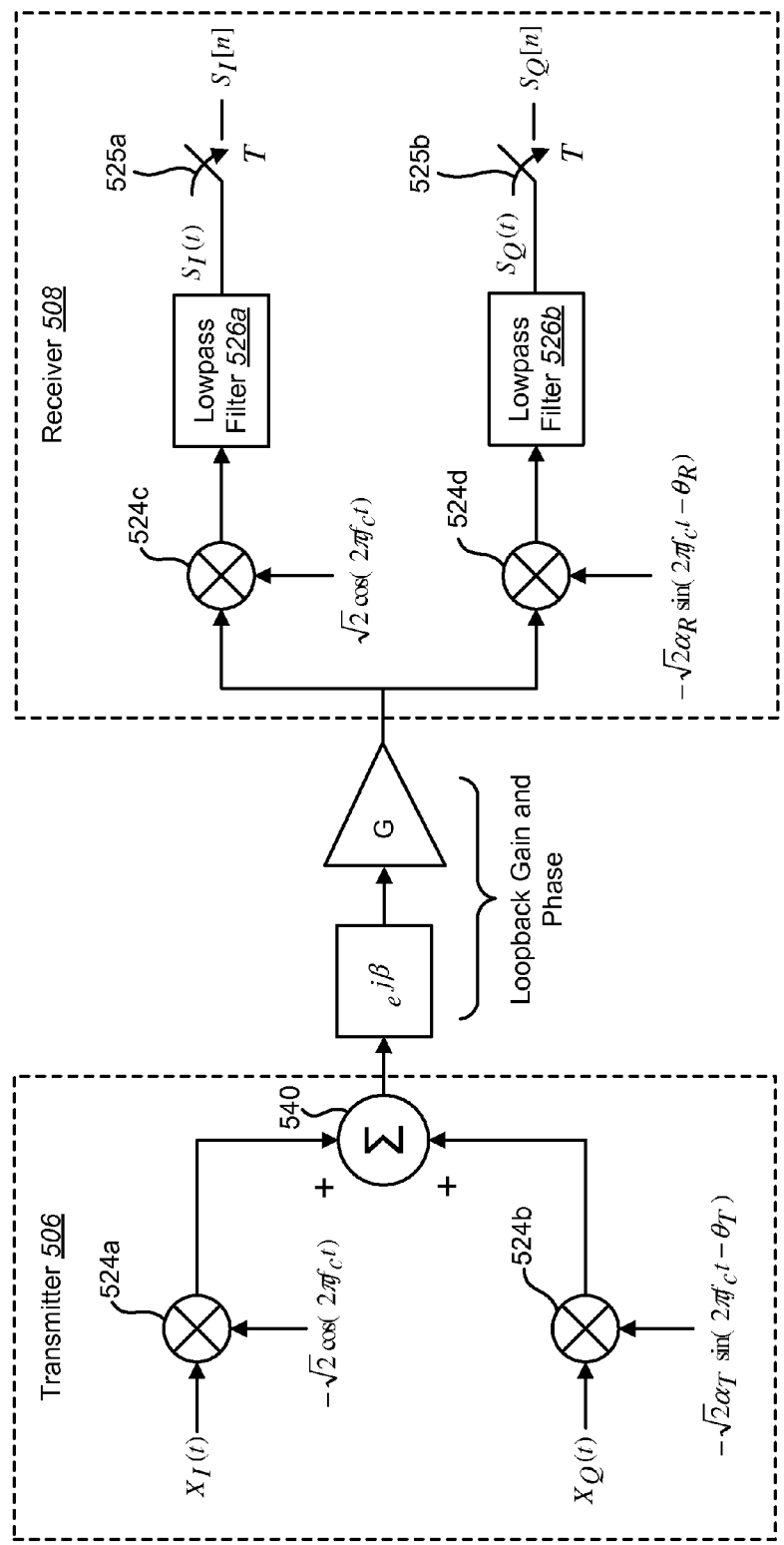
FIG. 5 is a block diagram illustrating a mathematical model of a transmitter and a receiver in a single system with I-Q imbalance.

FIG. 5 is a block diagram illustrating a mathematical model of a transmitter 506 and a receiver 508 in a single system 404 with I-Q imbalance. The transmitter 506 and the receiver 508 may be included in a single system 104 that may include a loopback path 434 for I-Q imbalance calibration. A transmitted baseband in-phase component $x_I(t)$ may be mixed with an in-phase signal ($\sqrt{2} \cos(2\pi f_c t)$) from a synthesizer 432 using a mixer 524a. The carrier frequency $f_c$ (e.g. 2420 megahertz (MHz)) may be provided by a synthesizer 432 that is common to the transmitter 506 and the receiver 508. A transmitted baseband quadrature component $x_Q(t)$ may be mixed with a quadrature signal ($-\sqrt{2}\alpha_T \sin(2\pi f_c t - \theta_T)$) from the synthesizer 432 using a mixer 524b, where $\alpha_T$ is the gain imbalance 120 of the transmitter 506 and $\theta_T$ is the phase imbalance 122 of the transmitter 506. The outputs of the mixers 524a,b may be combined using an adder 540.

The combined signal may be transmitted to a receiver 508 via an I-Q calibration loopback path 434. The loopback path 434 may include a loopback phase delay $\beta$ and a loopback path gain G.

The combined signal may be received at the receiver 508. The combined signal may be mixed with an in-phase signal ($\sqrt{2} \cos(2\pi f_c t)$) from the synthesizer 432 in a mixer 524c and passed through a lowpass filter 526a to produce an in-phase baseband component ($s_I(t)$). The combined signal may also be mixed with a quadrature signal ($-\sqrt{2}\alpha_R \sin(2\pi f_c t - \theta_R)$) in a mixer 524d and passed through a lowpass filter 526b to produce a quadrature baseband component ($s_Q(t)$), where $\alpha_R$ is the gain imbalance 120 of the receiver 508 and $\theta_R$ is the phase imbalance 122 of the receiver 508.

The received in-phase and quadrature components, $s_I(t)$ and $s_Q(t)$, in the presence of I-Q imbalance may be written as $$\begin{bmatrix} s_I(t) \\ s_Q(t) \end{bmatrix} = \begin{bmatrix} G\cos(\beta) & -G\alpha_T \sin(\beta - \theta_T) \\ G\alpha_R \sin(\beta + \theta_R) & G\alpha_T \alpha_R \cos(\beta + \theta_R - \theta_T) \end{bmatrix} \begin{bmatrix} x_I(t) \\ x_Q(t) \end{bmatrix}. \quad (6)$$

The in-phase component ($s_I(t)$) and the quadrature component ($s_Q(t)$) may be split in a splitter 525a,b. The splitter 525a,b may be a 3 dB splitter that splits the RF signal equally on the I branch and the Q branch. In FIG. 5, $s_I[n]$ and $s_Q[n]$ are the received baseband signals.

For I-Q calibration of the receiver 508, the transmitter 506 may transmit a complex baseband tone at frequency $f_{IF}$ (e.g., $x_I(t)=A \cos(2\pi f_{IF} t)$ and $x_Q(t)=A \sin(2\pi f_{IF} t)$. It is observed from Equation (6) that the received tone is impacted by both the transmitter and receiver I-Q imbalance.

Figure 6:
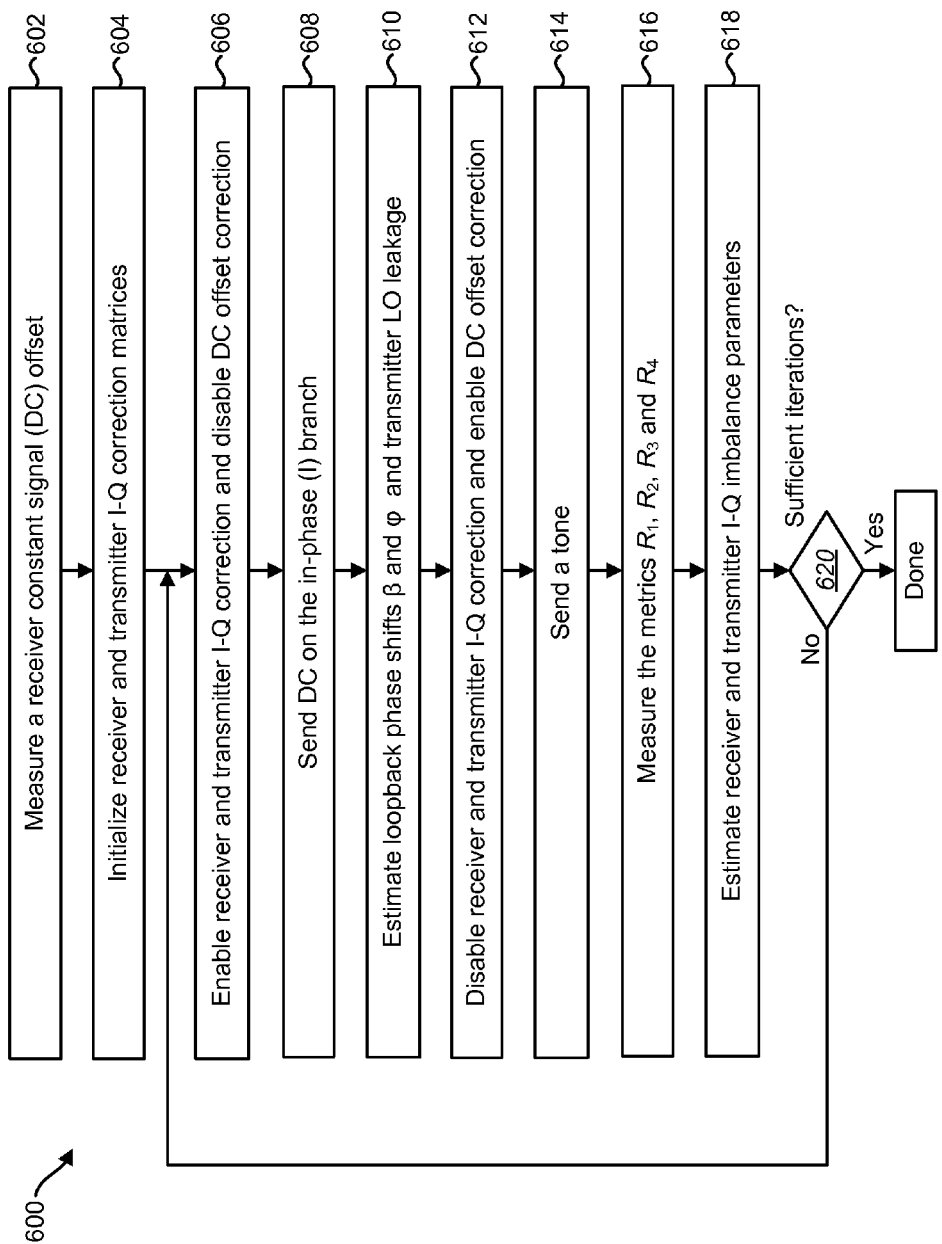
FIG. 6 is a flow diagram illustrating a method for I-Q imbalance calibration.

FIG. 6 is a flow diagram illustrating a method 600 for I-Q imbalance calibration. The method 600 may be implemented by a wireless communication device 102 with a single system 104 as described above in connection with FIG. 4. For example a transmitter 406 and a receiver 408 may have a common synthesizer 432. This method 600 performs receiver I-Q imbalance calibration by performing a joint estimation of transmitter and receiver I-Q imbalance parameters.

The wireless communication device 102 may measure 602 a receiver constant signal (DC) offset. A DC offset may be caused by leakage of a local oscillator (LO). The wireless communication device 102 may estimate the DC offset of the receiver 408.

The wireless communication device 102 may initialize 604 receiver and transmitter I-Q correction matrices. In one configuration, the receiver and transmitter I-Q correction matrices may be set to identity matrices.

The wireless communication device 102 may enable 606 receiver and transmitter I-Q correction. Upon enabling 606 receiver and transmitter I-Q correction the wireless communication device 102 may disable DC offset correction (if enabled).

The wireless communication device 102 may send 608 DC on the in-phase branch 428a, which may provide a differential measurement. The wireless communication device 102 may estimate 610 the loopback phase shift $\beta$ and the transmitter LO leakage.

The wireless communication device 102 may activate an analog constant delay (e.g., 45°) and repeat step 608 to estimate 610 the new loopback phase shift $\phi$. The wireless communication device 102 may then improve the transmitter LO leakage estimate.

The wireless communication device 102 may disable 612 receiver and transmitter I-Q correction and enable DC offset correction. The wireless communication device 102 may send 614 a tone and measure 616 metrics $R_1$ and $R_2$. The wireless communication device 102 may activate the analog constant delay (e.g., 45°) and repeat step 614 to measure 616 metrics $R_3$ and $R_4$.

The wireless communication device 102 may estimate 618 receiver and transmitter I-Q imbalance parameters. For example, the wireless communication device 102 may estimate 618 the receiver and transmitter I-Q gain and phase imbalance parameters based on the measured metrics $R_1$, $R_2$, $R_3$ and $R_4$. The wireless communication device 102 may update the receiver and transmitter I-Q imbalance correction matrices with the latest gain and phase imbalance parameters.

The wireless communication device 102 may determine 620 whether a sufficient number of iterations have occurred. The wireless communication device 102 may go back to step 606 and repeat for n iterations.

The iterative method 600 may provide acceptable calibration results in practice but it has some disadvantages. For instance, the method 600 is iterative and it runs for a predefined number of iterations (e.g. $N_{iter}=3$). After the last iteration, it is not known if the method 600 converged.

The method 600 may take a significant amount of time to finish. The total time required ($T_{req}$) for the algorithm to finish (excluding software overhead and latency) is $T_{req}=N_{iter} \cdot 6 \cdot t_{meas}$, where $N_{iter}$ is the number of iterations and $t_{meas}$ is the hardware measurement time for each step of the method 600. In one example, $N_{iter}=3$ and $t_{meas}=512$ microseconds ($\mu s$). In this case, the method 600 needs a $T_{req}=9.216$ milliseconds (ms). Typically, the method 600 may be executed at boot-up time and when there are temperature changes. However, one of the main difficulties is re-running method 600 whenever there is a temperature change. It may be very difficult to schedule method 600 that needs $T_{req}$ 10 ms between packets. Furthermore, the method 600 may be split into smaller sections, making the overall process much more complicated.

For the boot-up time, a $T_{req} \approx 10$ ms may not be very problematic. However, a typical receiver 108 uses active mixers (e.g., the mixer has different gains). Consequently, the calibration method 600 needs to be repeated for all the mixer gain settings. This in turn means that the I-Q calibration method 600 may significantly increase the boot-up time.

The method 600 may also use many approximations to obtain a linear system of equations that can be solved. Consequently, the solution given by method 600 will never be exact and there will always be a residual calibration error. The residual calibration error is typically small, but it depends heavily on chip architecture and on the wireless application (e.g., Bluetooth (BT), WiFi, LTE, etc.).

Furthermore, method 600 may obtain a joint estimate of the transmitter and receiver I-Q imbalance parameters by inverting a 4×4 matrix in fixed-point precision. Depending on the number of bits used to represent each matrix element and on the transmitter and receiver I-Q imbalance parameters, the fixed-point matrix inversion can diverge from the correct result.

Figure 7:
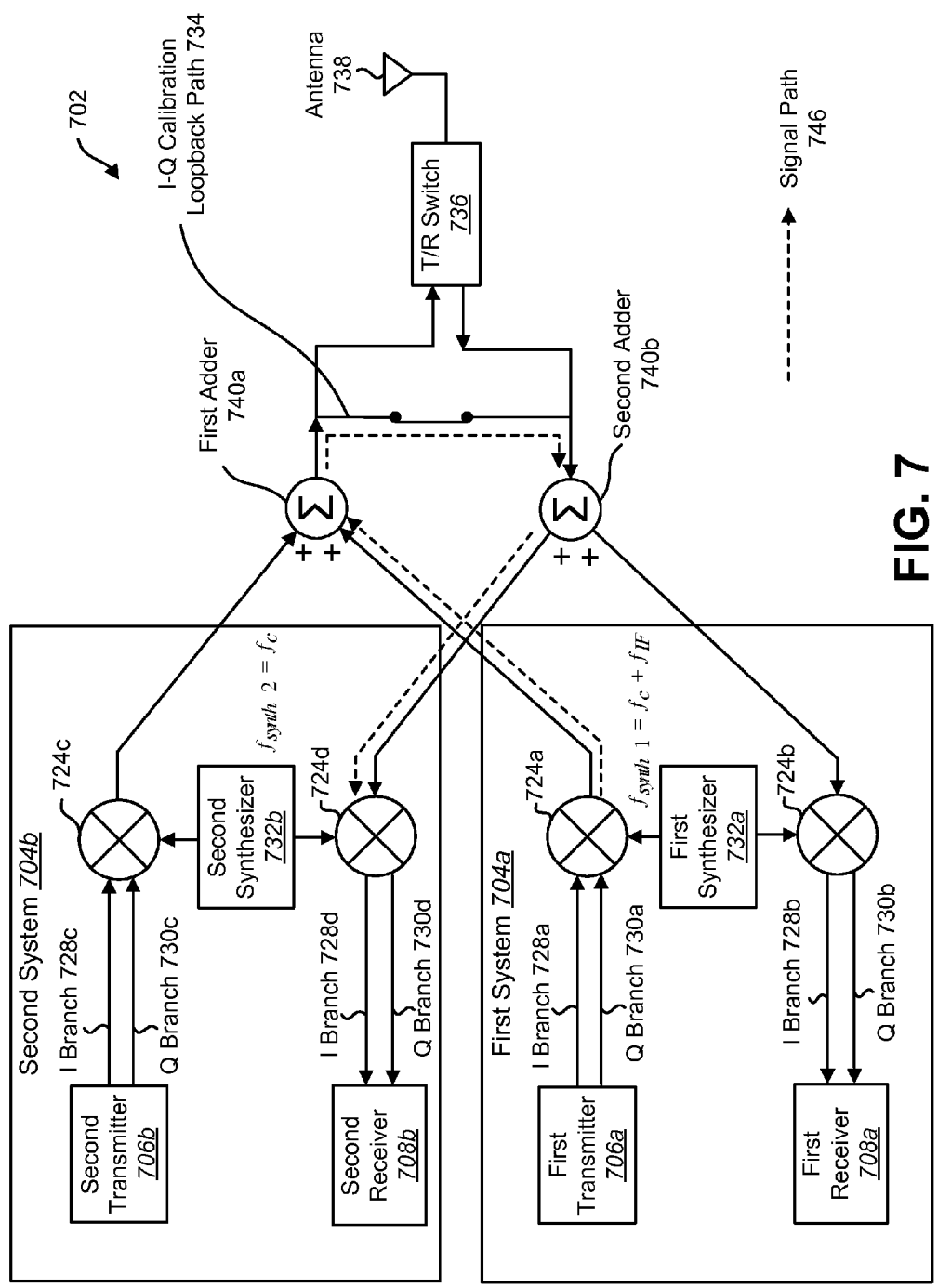
FIG. 7 is a block diagram illustrating two wireless systems configured for cooperative I-Q imbalance calibration.

FIG. 7 is a block diagram illustrating two wireless systems 704 configured for cooperative I-Q imbalance calibration. A wireless communication device 702 may include two wireless systems 704. The wireless systems 704 may be different types of wireless systems. For example, a first system 704a may be a WiFi system and a second system 704b may be a Bluetooth (BT) system. In one configuration, both wireless systems 704 may be included in a combined system on chip (SOC).

In general, the conditioning of the signals in a transmitter 706 and a receiver 708 may be performed by one or more stages of an amplifier, filter, upconverter, downconverter, etc. These circuit blocks may be arranged differently from the configuration shown in FIG. 7. Furthermore, other circuit blocks not shown in FIG. 7 may also be used to condition the signals in a transmitter 706 and a receiver 708. Some circuit blocks may also be omitted.

The first system 704a may include a first transmitter 706a, a first receiver 708a and a first synthesizer 732a. The first transmitter 706a may transmit a signal on an I branch 728a and a Q branch 730a that may be combined with in-phase and quadrature signals from a first synthesizer 732a in a mixer 724a to produce a combined signal. A combined signal may be received at a mixer 724b and separated into in-phase and quadrature components with in-phase and quadrature signals from the first synthesizer 732a. The in-phase component may be received at the first receiver 708a on an I branch 728b and the quadrature component may be received on a Q branch 730b.

The second system 704b may include a second transmitter 706b, a second receiver 708b and a second synthesizer 732b. The second transmitter 706b may transmit a signal on an I branch 728c and a Q branch 730c that may be combined with in-phase and quadrature signals from a second synthesizer 732b in a mixer 724c to produce a combined signal. A combined signal may be received at a mixer 724d and separated into in-phase and quadrature components with in-phase and quadrature signals from the second synthesizer 732b. The in-phase component may be received at the second receiver 708b on an I branch 728d and the quadrature component may be received on a Q branch 730d.

The output of the mixer 724a associated with the first transmitter 706a may be combined with the output of the mixer 724c associated with the second transmitter 706b in a first adder 740a. The output of the first adder 740a may be coupled to a transmit/receive (T/R) switch 736 and an antenna 738 for wireless transmission. The T/R switch 736 may be coupled to a second adder 740b. The output of the second adder 740b may be coupled to the input of the mixer 724b associated with the first receiver 708a and the input of the mixer 724d associated with the second receiver 708b.

An I-Q calibration loopback path 734 may be coupled to the shared path (e.g., the point where the signals from the two systems 704 are combined). The I-Q calibration loopback path 734 may include a switch that is operable to activate (e.g., close) I-Q calibration loopback path 734 during I-Q imbalance calibration and deactivate (e.g., open) I-Q calibration loopback path 734 after I-Q imbalance calibration. In one configuration, the I-Q calibration loopback path 734 may be coupled between the output of the first adder 740a and the input of the second adder 740b.

The first system 704a may set the first synthesizer 732a to a first frequency $f_{synth1}=f_c+f_{IF}$. The second system 704b may set the second synthesizer 732b to a second frequency $f_{synth2}=f_c$. In one example, $f_c$=2412 MHz (e.g., a channel frequency) and $f_{IF}$ is a low intermediate frequency, (e.g., 500 KHz). Furthermore, the first system 704a may transmit (via the first transmitter 706a) a constant value (e.g., direct current (DC)) on the I branch 728a and Q branch 730a. The second receiver 708b in the second system 704b may receive the signal on the signal path 746. The second receiver 708b in the second system 704b may perceive the signal from the first system 704a as an ideal complex baseband tone (i.e., without any I-Q imbalance) at frequency $f_{IF}$ because the frequencies of the first synthesizer 732a and the second synthesizer 732b differ by $f_{IF}$.

The I-Q imbalance for the second receiver 708b may be estimated based on the received signal (e.g., the received baseband tone). In one configuration, the wireless communication device 702 may measure the I branch power 114 and the Q branch power 116 of the second receiver 708b. The wireless communication device 702 may also measure a cross-correlation 118 between the I branch 728 and the Q branch 730 of the second receiver 708b. The wireless communication device 702 may determine a gain imbalance 120 of the second receiver 708b based on the I branch power 114 and the Q branch power 116. The wireless communication device 702 may also determine a phase imbalance 122 of the second receiver 708b based on the cross-correlation 118 and the I branch power 114. Estimating the I-Q imbalance for the second receiver 708b is discussed in more detail in connection with FIG. 8. It should be noted that the I-Q imbalance of the first receiver 708a may be calibrated by repeating the methodology described above but flipping the operations for each system 704.

Figure 8:
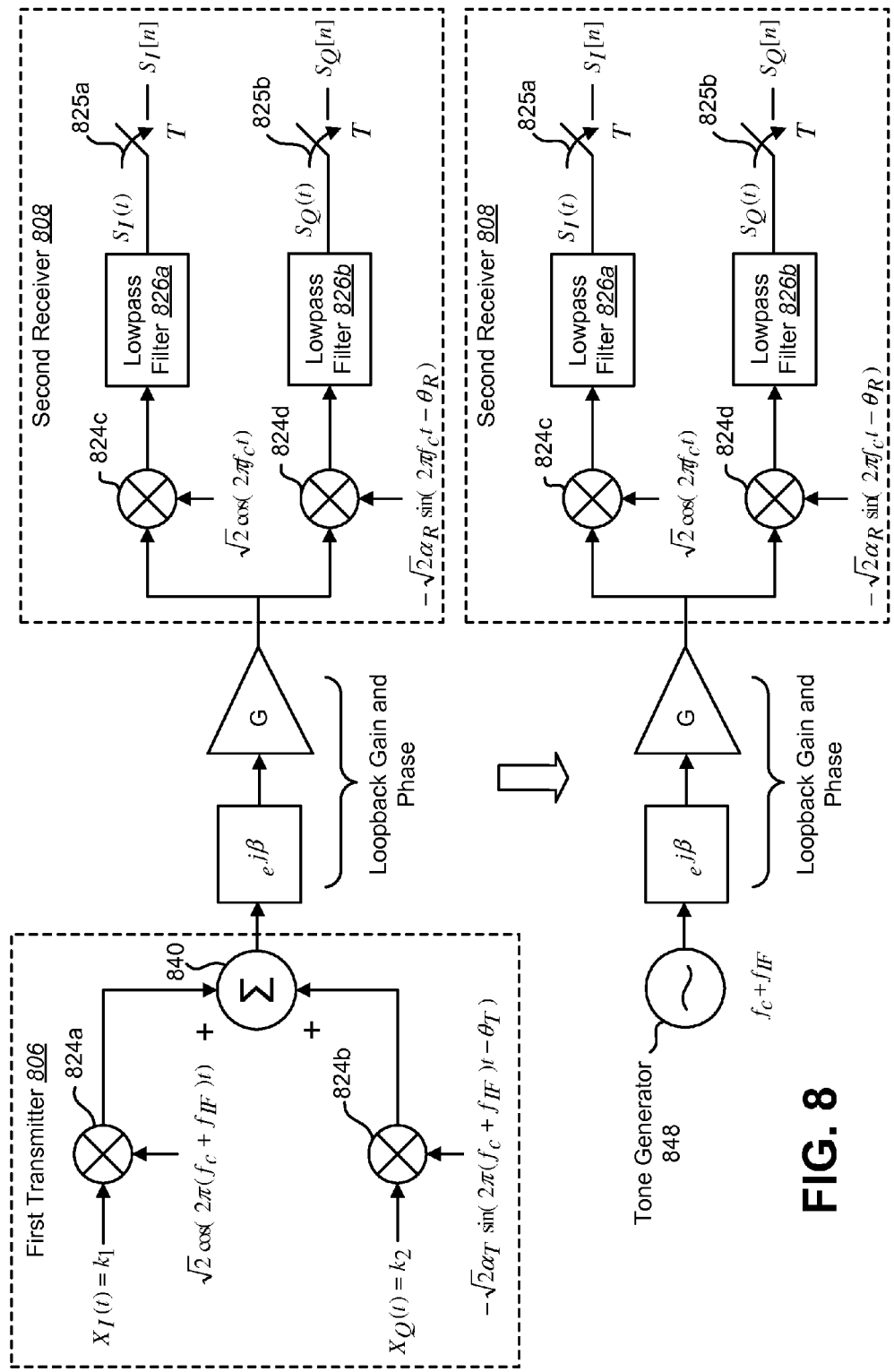
FIG. 8 is a block diagram illustrating a mathematical model of cooperative I-Q imbalance calibration of a second receiver.

FIG. 8 is a block diagram illustrating a mathematical model of cooperative I-Q imbalance calibration of a second receiver 808. A first transmitter 806 may be included in a first system 704a and the second receiver 808 may be included in a second system 704b as described above in connection with FIG. 7. The first system 704a and the second system 704b may be different types of wireless systems (e.g., WiFi, BT, LTE, etc.).

In one configuration, a first synthesizer 732a may be set to a first frequency ($f_{synth1}=f_c+f_{IF}$), where $f_c$ is a carrier frequency and $f_{IF}$ is a low intermediate frequency. A transmitted baseband in-phase component $x_I(t)$ may be a constant value ($k_I$) that is mixed with an in-phase signal ($\sqrt{2}\cos(2\pi(f_c+f_{IF})t)$) from the first synthesizer 732a using a mixer 824a. A transmitted baseband quadrature component $x_Q(t)$ may be a constant value ($k_2$) that is mixed with a quadrature signal ($-\sqrt{2}\alpha_T \sin(2\pi(f_c+f_{IF})t-\theta_T)$) from the first synthesizer 732a using a mixer 824b, where $\alpha_T$ is the gain imbalance 120 of the first transmitter 806 and $\theta_T$ is the phase imbalance 122 of the first transmitter 806. The outputs of the mixers 824a,b may be combined using an adder 840.

The combined signal may be transmitted to the second receiver 808 via an I-Q calibration loopback path 734. The loopback path 734 may include a loopback phase delay β and a loopback path gain G.

The combined signal may be received at the second receiver 808. The second synthesizer 732b associated with the second receiver 808 may be set to a second frequency ($f_{synth2}=f_c$). The combined signal may be mixed with an in-phase signal ($\sqrt{2}\cos(2\pi f_c t)$) from the second synthesizer 732b in a mixer 824c and passed through a lowpass filter 826a to produce an in-phase baseband component $s_I(t)$). The combined signal may also be mixed with a quadrature signal ($-\sqrt{2}\alpha_R \sin(2\pi f_c t - \theta_R)$) from the second synthesizer 732b in a mixer 824d and passed through a lowpass filter 826b to produce a quadrature baseband component ($s_Q(t)$), where $\alpha_R$ is the gain imbalance 120 of the second receiver 808 and $\theta_R$ is the phase imbalance 122 of the second receiver 808.

The in-phase component ($s_I(t)$) and the quadrature component ($s_Q(t)$) may be split in a splitter 825a,b. The splitter 825a,b may be a 3 dB splitter that splits the RF signal equally on the I branch and the Q branch. In FIG. 8, $s_I[n]$ and $s_Q[n]$ are the received baseband signals.

In FIG. 8, the first transmitter 806 may be seen as an ideal tone generator 848 (without I-Q imbalance) at frequency $f_c + f_{IF}$ when the first synthesizer 732a frequency is set to $f_{synth1} = f_c + f_{IF}$ and a constant signal (DC) is transmitted on the I branch 728 and Q branch 730 paths. The transmitted signal $y_{Tx}(t)$ may be written according to Equation (7).

$$y_{Tx}(t) = k_1 \cdot \sqrt{2} \cos(2\pi(f_c + f_{IF})t) - k_2 \cdot \sqrt{2} \alpha_T \sin(2\pi(f_c + f_{IF})t - \theta_T) \quad (7)$$
$$= \sqrt{2} A \cos(2\pi(f_c + f_{IF})t + \phi)$$

In Equation (7), A and $\phi$ are the magnitude and phase of the resulting tone, respectively, and can be written as $A = \sqrt{k_1^2 + k_2^2 \alpha_T^2 + 2k_1 k_2 \alpha_T \sin(\theta_T)}$ and $$\phi = \tan^{-1}\left(\frac{k_2 \alpha_T \cos(\theta_T)}{k_1 + k_2 \alpha_T \sin(\theta_T)}\right).$$

The received in-phase and quadrature baseband components $s_I(t)$ and $s_Q(t)$, may be written according to Equation (8).

$$\begin{bmatrix} s_I(t) \\ s_Q(t) \end{bmatrix} = \begin{bmatrix} G\cos(\beta) & -G\sin(\beta) \\ G\alpha_R \sin(\beta + \theta_R) & G\alpha_R \cos(\beta + \theta_R) \end{bmatrix} \begin{bmatrix} x_I(t) \\ x_Q(t) \end{bmatrix} \quad (8)$$
$$= \begin{bmatrix} G\cos(\beta) & -G\sin(\beta) \\ G\alpha_R \sin(\beta + \theta_R) & G\alpha_R \cos(\beta + \theta_R) \end{bmatrix} \begin{bmatrix} A\cos(2\pi f_{IF} t + \phi) \\ A\sin(2\pi f_{IF} t + \phi) \end{bmatrix}$$
$$= \begin{bmatrix} GA\cos(2\pi f_{IF} t + \phi + \beta) \\ GA\alpha_R \sin(2\pi f_{IF} t + \phi + \beta + \theta_R) \end{bmatrix}$$

The gain imbalance $\alpha_R$ 120 and phase imbalance $\theta_R$ 122 of the second receiver 808 may be estimated by computing the received I branch power 114 ($E[s_I(t)^2]$), the received Q branch power 116 ($E[s_Q(t)^2]$) and the cross-correlation 118 between the received signals on the I branch and the Q branch ($E[s_I(t)s_Q(t)]$). It should be noted that as used herein, E[x] represents the expectation operator and gives the average value of x.

The received I branch power 114 ($E[s_I(t)^2]$) may be written according to Equation (9).

$$E[s_I(t)^2] = E[(GA\cos(2\pi f_{IF} t + \phi + \beta))^2] \quad (9)$$
$$= \frac{G^2 A^2}{2}$$

The Q branch power 116 ($E[s_Q(t)^2]$) may be written according to Equation (10).

$$E[s_Q(t)^2] = E[(GA\alpha_R \sin(2\pi f_{IF} t + \phi + \beta + \theta_R))^2] \quad (10)$$
$$= \frac{G^2 A^2}{2} \alpha_R^2$$

The cross-correlation 118 between the received signals on the I branch and the Q branch ($E[s_I(t)s_Q(t)]$) may be computed according to Equation (11).

$$E[s_I(t)s_Q(t)] = E[GA\cos(2\pi f_{IF} t + \phi + \beta) \cdot GA\alpha_R \sin(2\pi f_{IF} t + \phi + \beta + \theta_R)] \quad (11)$$
$$= \frac{G^2 A^2}{2} \alpha_R \sin(\theta_R)$$

The gain imbalance $\alpha_R$ 120 of the second receiver 808 may be determined based on the power on the I branch 728 and the power on the Q branch 730. The gain imbalance $\alpha_R$ of the second receiver 808 may be estimated by computing the metric $R_1$ according to Equation (12).

$$R_1 = \frac{E[s_I(t)^2]}{E[s_Q(t)^2]} = \alpha_R^2 \quad (12)$$

The gain imbalance $\alpha_R$ 120 is then obtained by $\alpha_R = \sqrt{R_1}$.

The phase imbalance $\theta_R$ 122 of the second receiver 808 may be determined based on the cross-correlation 118 between the I branch 728 and the Q branch 730 and the I branch power 114. To estimate the phase imbalance $\theta_R$ 122 of the second receiver 908, the metric $R_2$ may be defined according to Equation (13).

$$R_2 = \frac{E[s_I(t)s_Q(t)]}{E[s_I(t)^2]} \quad (13)$$
$$= \alpha_R \sin(\theta_R)$$
$$= \sqrt{R_1} \sin(\theta_R)$$

The phase imbalance $\theta_R$ 122 may be obtained by solving Equation (13). Therefore, $$\theta_R = \arcsin\left(\frac{R_2}{\sqrt{R_1}}\right).$$

Figure 9:
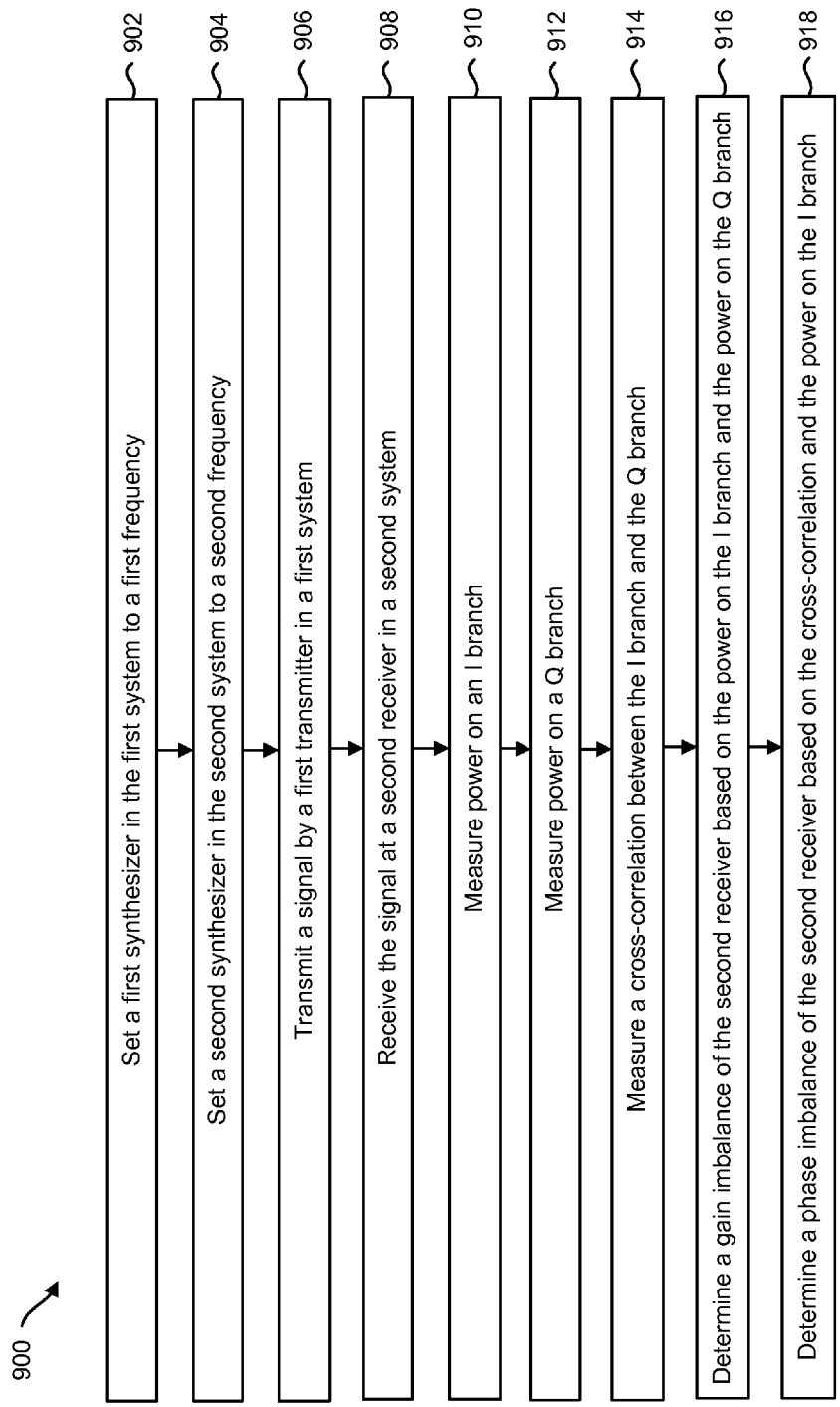
FIG. 9 is a flow diagram illustrating a detailed configuration of a method for I-Q imbalance calibration.

FIG. 9 is a flow diagram illustrating a detailed configuration of a method 900 for I-Q imbalance calibration. The method 900 may be performed by a wireless communication device 102 that includes a first system 104a and a second system 104b. The first system 104a and the second system 104b may be different types of wireless systems. For example, the first system 104a may be a WiFi system and the second system 104b may be a Bluetooth (BT) system. The first system 104a and the second system 104b may be on a single combined system on chip (SOC).

The wireless communication device 102 may set 902 a first synthesizer 132a in a first system 104a to a first frequency ($f_{synth1}$). In one configuration, the first frequency $f_{synth1} = f_c + f_{IF}$, where $f_c$ is a carrier (or channel) frequency and $f_{IF}$ is a low intermediate frequency. The wireless communication device 102 may set 904 a second synthesizer 132b in the second system 104b to a second frequency ($f_{synth2}$). Therefore, the first frequency and the second frequency differ by a third frequency (e.g. $f_{IF}$).

The wireless communication device 102 may transmit 906 a signal 110 by a first transmitter 106a in the first system 104a. The signal 110 may include a constant value. For example, the signal 110 may include a transmitted baseband in-phase component $x_I(t)$ set to a constant value ($k_1$). The signal 110 may also include a transmitted baseband quadrature component $x_Q(t)$ set to a constant value ($k_2$). The in-phase component $x_I(t)$ may be mixed with an in-phase signal ($\sqrt{2} \cos(2\pi(f_c+f_{IF})t)$) from the first synthesizer 132a and the quadrature component $x_Q(t)$ may be mixed with a quadrature signal ($-\sqrt{2}\alpha_T \sin(2\pi(f_c+f_{IF})t-\theta_T)$) from the first synthesizer 132a to produce a combined signal 110.

The wireless communication device 102 may receive 908 the signal 110 at a second receiver 108b in the second system 104b. The signal 110 may be received 908 at the second receiver 108b via an I-Q calibration loopback path 734. In one configuration, the I-Q calibration loopback path 734 may include a switch that is operable to activate (e.g., close) I-Q calibration loopback path 734 during I-Q imbalance calibration and deactivate (e.g., open) I-Q calibration loopback path 734 after I-Q imbalance calibration.

The combined signal 110 may be mixed with an in-phase signal ($\sqrt{2} \cos(2\pi f_c t)$) from the second synthesizer 132b to produce an in-phase baseband component ($s_I(t)$). The combined signal 110 may also be mixed with a quadrature signal ($-\sqrt{2}\alpha_R \sin(2\pi f_c t-\theta_R)$) from the second synthesizer 132b to produce a quadrature baseband component ($s_Q(t)$). The received signal 110 may be affected by a gain imbalance $\alpha_R$ and the phase imbalance $\theta_R$ of the second receiver 108b.

The wireless communication device 102 may estimate an I-Q imbalance for the second receiver 108b based on the received signal 110. The wireless communication device 102 may measure 910 power on the I branch (e.g., the I branch power 114 ($E[s_I(t)^2]$)) of the second receiver 108b. The wireless communication device 102 may measure 912 power on the Q branch (e.g., the Q branch power 116 ($E[s_Q(t)^2]$)) of the second receiver 108b. The wireless communication device 102 may also measure 914 a cross-correlation 118 ($E[s_I(t)s_Q(t)]$) between the I branch and the Q branch of the second receiver 108b.

The wireless communication device 102 may determine 916 a gain imbalance $\alpha_R$ 120 of the second receiver 108b based on the I branch power 114 and the Q branch power 116. This may be accomplished according to Equation (12) above. For example, the wireless communication device 102 may obtain the $R_1$ metric by dividing the measured I branch power 114 ($E[s_I(t)^2]$) by the measured Q branch power 116 ($E[s_Q(t)^2]$). The wireless communication device 102 may then determine 916 the gain imbalance $\alpha_R$ 120 of the second receiver 108b by taking the square root of the $R_1$ metric (e.g., $\alpha_R=\sqrt{R_1}$).

The wireless communication device 102 may determine 918 a phase imbalance $\theta_R$ 122 of the second receiver 108b based on the cross-correlation 118 and the I branch power 114. This may be accomplished according to Equation (13) above. For example, the wireless communication device 102 may obtain the $R_2$ metric by dividing the cross-correlation 118 ($E[s_I(t)s_Q(t)]$) by the I branch power 114 ($E[s_I(t)^2]$). The wireless communication device 102 may then determine 918 the phase imbalance $\theta_R$ 122 of the second receiver 108b by solving Equation (13) using the $R_1$ and $R_2$ metrics.

Figure 10:
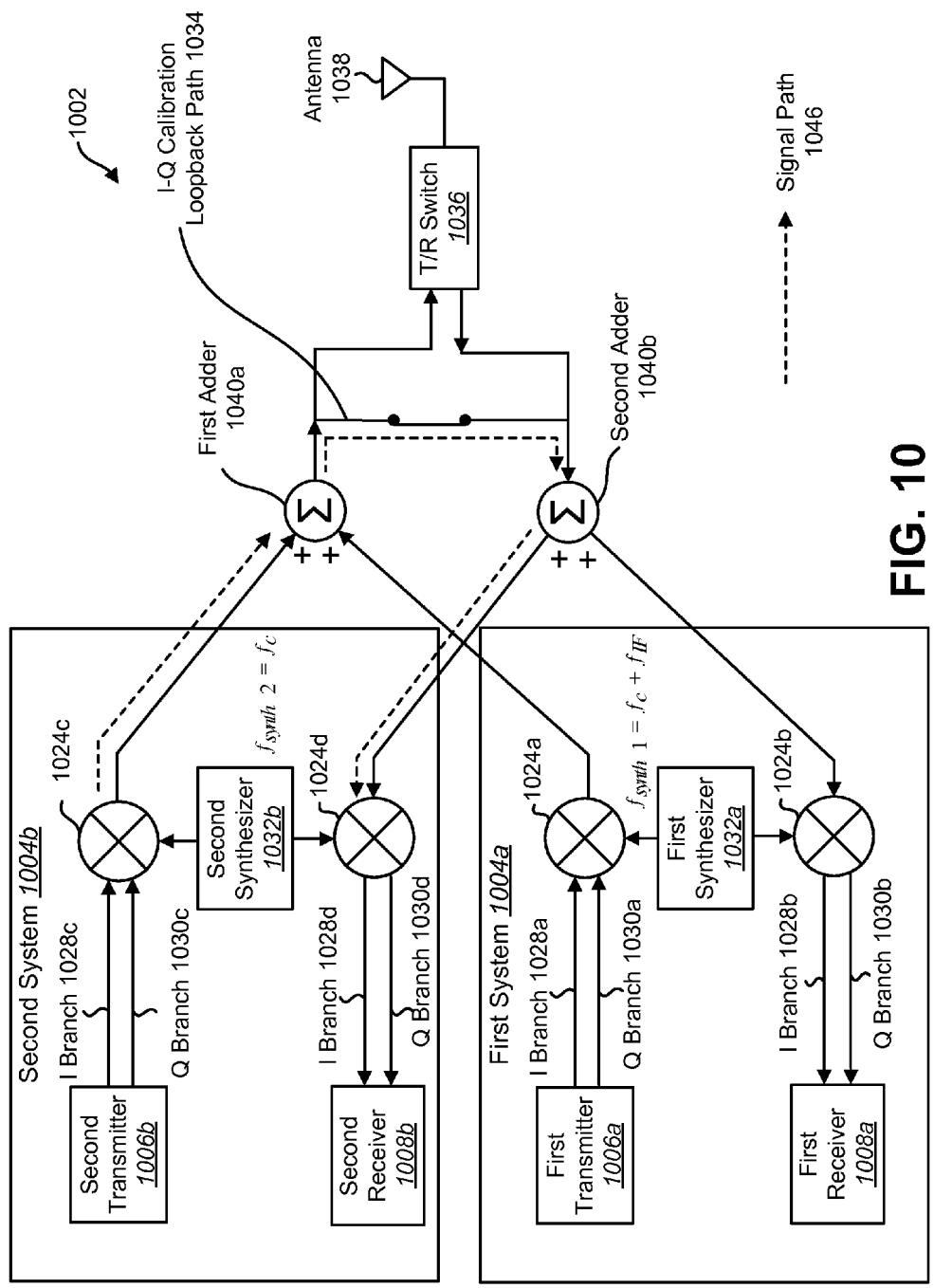
FIG. 10 is a block diagram illustrating another configuration of two wireless systems configured for cooperative I-Q imbalance calibration.

FIG. 10 is a block diagram illustrating another configuration of two wireless systems 1004 configured for cooperative I-Q imbalance calibration. A wireless communication device 1002 may include two wireless systems 1004 as described above in connection with FIG. 7. The wireless systems 1004 may be different types of wireless systems. For example, a first system 1004a may be a WiFi system and a second system 1004b may be a Bluetooth (BT) system. In one configuration, both wireless systems 1004 may be included in a combined system on chip (SOC).

The first system 1004a may include a first transmitter 1006a, a first receiver 1008a and a first synthesizer 1032a. The first transmitter 1006a may transmit a signal on an I branch 1028a and a Q branch 1030a that may be combined with in-phase and quadrature signals from a first synthesizer 1032a in a mixer 1024a to produce a combined signal. A combined signal may be received at a mixer 1024b and separated into in-phase and quadrature components with in-phase and quadrature signals from the first synthesizer 1032a. The in-phase component may be received at the first receiver 1008a on an I branch 1028b and the quadrature component may be received on a Q branch 1030b.

The second system 1004b may include a second transmitter 1006b, a second receiver 1008b and a second synthesizer 1032b. The second transmitter 1006b may transmit a signal on an I branch 1028c and a Q branch 1030c that may be combined with in-phase and quadrature signals from a second synthesizer 1032b in a mixer 1024c to produce a combined signal. A combined signal may be received at a mixer 1024d and separated into in-phase and quadrature components with in-phase and quadrature signals from the second synthesizer 1032b. The in-phase component may be received at the second receiver 1008b on an I branch 1028d and the quadrature component may be received on a Q branch 1030d.

The output of the mixer 1024a associated with the first transmitter 1006a may be combined with the output of the mixer 1024c associated with the second transmitter 1006b in a first adder 1040a. The output of the first adder 1040a may be coupled to a transmit/receive (T/R) switch 1036 and an antenna 1038 for wireless transmission. The T/R switch 1036 may be coupled to a second adder 1040b. The output of the second adder 1040b may be coupled to the input of the mixer 1024b associated with the first receiver 1008a and the input of the mixer 1024d associated with the second receiver 1008b.

An I-Q calibration loopback path 1034 may be coupled to the shared path (e.g., the point where the signals from the two systems 1004 are combined). The I-Q calibration loopback path 1034 may include a switch that is operable to activate (e.g., close) I-Q calibration loopback path 1034 during I-Q imbalance calibration and deactivate (e.g., open) I-Q calibration loopback path 1034 after I-Q imbalance calibration. In one configuration, the I-Q calibration loopback path 1034 may be coupled between the output of the first adder 1040a and the input of the second adder 1040b.

After having calibrated the I-Q imbalance of the second receiver 1008b, as described above in connection with FIG. 7, the I-Q imbalance of the second transmitter 1006b may be calibrated. The second transmitter 1006b may transmit a digital tone. The second transmitter 1006b may generate a digital tone at frequency $f_{IF}$. The second receiver 1008b may receive the digital tone. For instance, the radio frequency (RF) signal (e.g., the digital tone) may be looped back to the calibrated second receiver 1008b via the signal path 1046 as illustrated in FIG. 10.

The I-Q imbalance for the second transmitter 1006b may be estimated based on the received digital tone (e.g., the received baseband tone) after the second receiver 1008b has been calibrated for I-Q imbalance. In one configuration, the wireless communication device 1002 may measure the I branch power 114 and the Q branch power 116 of the second receiver 1008b. The I branch power 114 and the Q branch power 116 of the second receiver 1008b may be measured after an I-Q calibration module (described below in connection with FIG. 13). The wireless communication device 1002 may also measure a cross-correlation 118 between the I branch 1028 and the Q branch 1030 of the second receiver 1008b. The cross-correlation 118 of the second receiver 1008b may also be measured after an I-Q calibration module (described below in connection with FIG. 13).

The wireless communication device 1002 may determine a gain imbalance 120 of the second transmitter 1006b based on the I branch power 114 and the Q branch power 116 of the second receiver 1008b. The wireless communication device 1002 may also determine a phase imbalance 122 of the second transmitter 1006b based on the cross-correlation 118 and the I branch power 114. Estimating the I-Q imbalance for the second transmitter 1006b is discussed in more detail in connection with FIG. 11. It should be noted that the I-Q imbalance of the first transmitter 1006a may be calibrated by repeating the methodology described above but flipping the operations for each system 1004.

Figure 11:
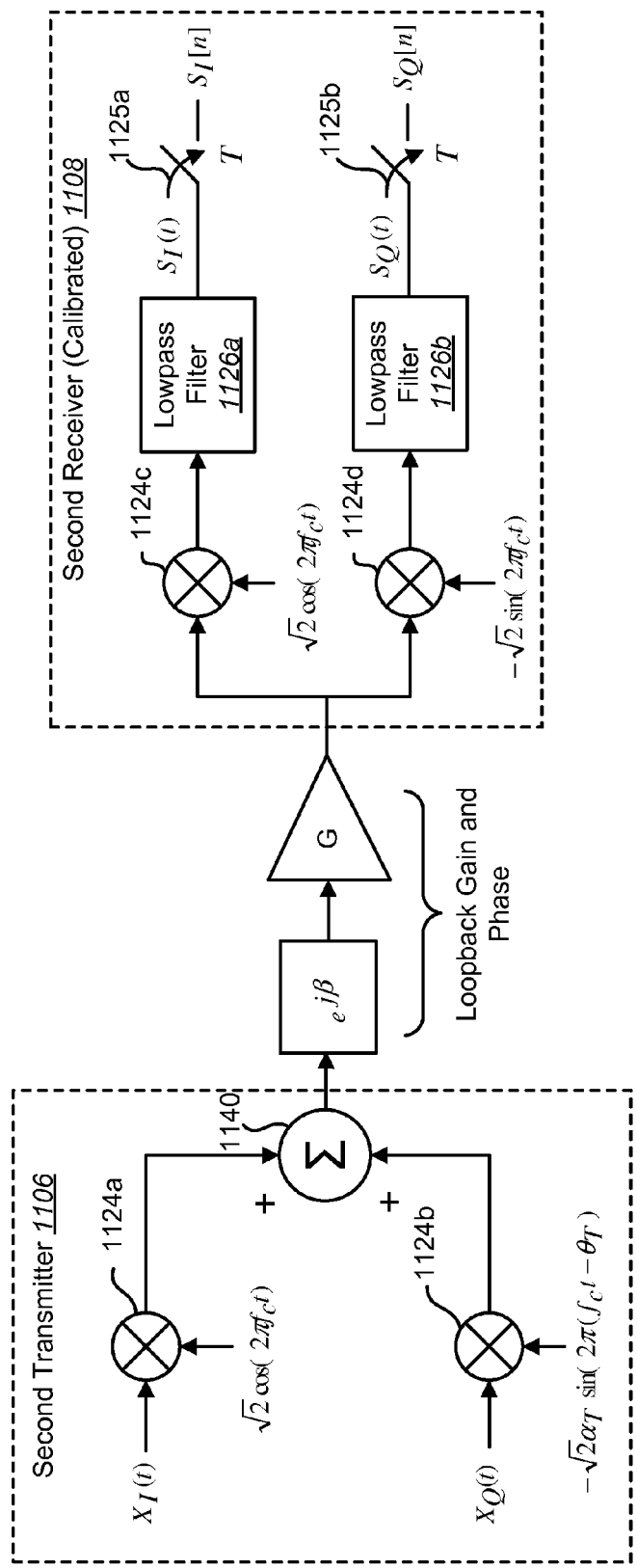
FIG. 11 is a block diagram illustrating a mathematical model of cooperative I-Q imbalance calibration of a second transmitter.

FIG. 11 is a block diagram illustrating a mathematical model of cooperative I-Q imbalance calibration of a second transmitter 1106. Both the second transmitter 1106 and the second receiver 1108 may be included in a second system 1004b as described above in connection with FIG. 10. The second system 1004b may be a wireless system (e.g., WiFi, BT, LTE, etc.). The second receiver 1108 may be calibrated as described above in connection with FIG. 7.

After the second receiver 1108 has been calibrated, the second transmitter 1106 may generate a digital tone at frequency $f_{IF}$. The transmitted baseband in-phase component $x_I(t)$ may be written as $x_I(t)=A\cos(2\pi f_{IF}t)$ and the transmitted baseband quadrature component $x_Q(t)$ may be written as $x_Q(t)=A\sin(2\pi f_{IF}t)$. The transmitted baseband in-phase component $x_I(t)$ may be mixed with an in-phase signal ($\sqrt{2}\cos(2\pi f_c t)$) from the second synthesizer 1032b using a mixer 1124a. The transmitted baseband quadrature component $x_Q(t)$ may be mixed with a quadrature signal ($-\sqrt{2}\alpha_T \sin(2\pi f_c t-\theta_T)$) from the second synthesizer 1032b using a mixer 1124b, where $\alpha_T$ is the gain imbalance of the second transmitter 1106 and $\theta_T$ is the phase imbalance of the second transmitter 1106. The outputs of the mixers 1124a,b may be combined using an adder 1140.

The combined signal may be transmitted to the second receiver 1108 via an I-Q calibration loopback path 1034. The loopback path 1034 may include a loopback phase delay β and a loopback path gain G.

The combined signal may be received at the second receiver 1108. The second synthesizer 1032b associated with the second receiver 1108 may be set to a second frequency ($f_{synth2}=f_c$). The combined signal may be mixed with the in-phase signal ($\sqrt{2}\cos(2\pi f_c t)$) from the second synthesizer 1032b in a mixer 1124c and passed through a lowpass filter 1126a to produce an in-phase baseband component ($s_I(t)$). The combined signal may also be mixed with a quadrature signal ($-\sqrt{2}\sin(2\pi f_c t)$) in a mixer 1124d and passed through a lowpass filter 1126b to produce a quadrature baseband component ($s_Q(t)$).

The in-phase component ($s_I(t)$) and the quadrature component ($s_Q(t)$) may be split in a splitter 1125a,b. The splitter 1125a,b may be a 3 dB splitter that splits the RF signal equally on the I branch and the Q branch. In FIG. 1, $s_I[n]$ and $s_Q[n]$ are the received baseband signals.

The gain imbalance $\alpha_T$ 120 and phase imbalance $\theta_T$ 122 of the second transmitter 1106 may be estimated by computing the received I branch power 114 ($E[s_I(t)^2]$), the received Q branch power 116 ($E[s_Q(t)^2]$) and the cross-correlation 118 between the received signals on the I branch and the Q branch ($E[s_I(t)s_Q(t)]$) of the second receiver 1108. The gain imbalance $\alpha_T$ 120 of the second transmitter 1106 may be determined based on the power on the I branch 1028 and the power on the Q branch 1030 of the second receiver 1108. The gain imbalance $\alpha_T$ 120 of the second transmitter 1106 may be estimated by computing the metric $R_1$ according to Equation (12) above, replacing $\alpha_R$ with $\alpha_T$. The gain imbalance $\alpha_T$ is then obtained by $\alpha_T=\sqrt{R_1}$.

The phase imbalance $\theta_R$ of the second transmitter 1106 may be determined based on the cross-correlation 118 between the I branch 728 and the Q branch 730 and the I branch power 114 of the second receiver 1108. The phase imbalance $\theta_T$ of the second transmitter 1106 may be obtained by solving Equation (13) above, replacing $\theta_R$ with $\theta_T$. Therefore, $$\theta_T = \arcsin\left(\frac{R_2}{\sqrt{R_1}}\right).$$

The cooperative I-Q imbalance calibration described herein provides several benefits. For instance, the described cooperative I-Q imbalance calibration is not iterative and, therefore, there are no convergence issues. The cooperative I-Q imbalance calibration is much faster than the known method 600. In order to calibrate the receiver I-Q imbalance and the transmitter I-Q imbalance, cooperative I-Q imbalance calibration utilizes only two measurement sets (one for the receiver and another for the transmitter). The total time required (excluding software overhead and latency) is given by Equation (14).

$$T_{req}=2\cdot t_{meas} \quad (14)$$

In Equation (14), $t_{meas}$ is the hardware measurement time for one set of $R_1$ and $R_2$ metrics. Assuming the same time for $t_{meas}$ ($t_{meas}=512$ μs), as described above in connection with FIG. 6, cooperative I-Q imbalance calibration needs $T_{req}=1.024$ ms, which is 9 times shorter than the time required for the known method 600 ($T_{req}=9.216$ ms). This is a significant advantage since it is easier to re-run cooperative I-Q imbalance calibration whenever there is a temperature change. For example, cooperative I-Q imbalance calibration may be easily scheduled to run between packets.

Additionally, certain applications or architectures may only perform receiver I-Q imbalance calibration. As seen above, cooperative I-Q imbalance calibration may be decoupled in the transmitter and receiver sections. If only receiver I-Q calibration is desired, then cooperative I-Q imbalance calibration uses half the time given by Equation (14). In contrast, the known method 600 always performs a joint calibration for the transmitter I-Q imbalance and the receiver I-Q imbalance. In other words, when using the known method 600, it is not possible to reduce the time required for calibration when only the receiver needs to be calibrated.

Contrary to the known method 600, cooperative I-Q imbalance calibration does not use any approximations. Therefore, there are no residual calibration errors. Hence, the precision of the cooperative algorithm is only limited by the signal-to-noise ratio (SNR), quantization noise and phase noise.

Furthermore, cooperative I-Q imbalance calibration does not require any matrix inversions. The closed-form solutions for the gain and phase imbalance parameters are given by Equations (12) and (13), respectively.

Figure 12:
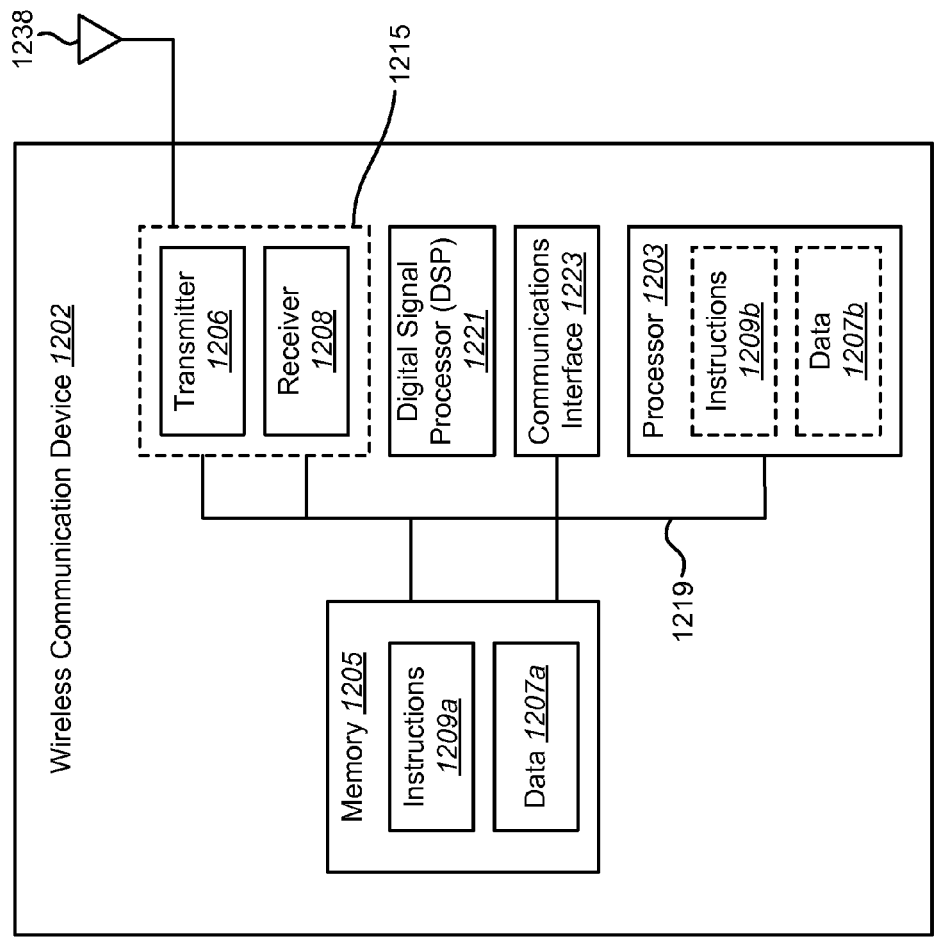
FIG. 12 illustrates certain components that may be included within a wireless communication device.

FIG. 12 illustrates certain components that may be included within a wireless communication device 1202. The wireless communication device 1202 may be an access terminal, a mobile station, a user equipment (UE), etc. The wireless communication device 1202 includes a processor 1203. The processor 1203 may be a general purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless communication device 1202 of FIG. 12, in an alternative configuration, a combination of processors (e.g., an ARM and DSP) could be used.

The wireless communication device 1202 also includes memory 1205. The memory 1205 may be any electronic component capable of storing electronic information. The memory 1205 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 1207a and instructions 1209a may be stored in the memory 1205. The instructions 1209a may be executable by the processor 1203 to implement the methods disclosed herein. Executing the instructions 1209a may involve the use of the data 1207a that is stored in the memory 1205. When the processor 1203 executes the instructions 1209a, various portions of the instructions 1209b may be loaded onto the processor 1203, and various pieces of data 1207b may be loaded onto the processor 1203.

The wireless communication device 1202 may also include a transmitter 1206 and a receiver 1208 to allow transmission and reception of signals to and from the wireless communication device 1202. The transmitter 1206 and receiver 1208 may be collectively referred to as a transceiver 1215. An antenna 1238 may be electrically coupled to the transceiver 1215. The wireless communication device 1202 may also include (not shown) multiple transmitters, multiple receivers, multiple transceivers and/or multiple antennas.

The wireless communication device 1202 may include a digital signal processor (DSP) 1221. The wireless communication device 1202 may also include a communications interface 1223. The communications interface 1223 may allow a user to interact with the wireless communication device 1202.

The various components of the wireless communication device 1202 may be coupled together by one or more buses, which may include a power bus, a control signal bus, a status signal bus, a data bus, etc. For the sake of clarity, the various buses are illustrated in FIG. 12 as a bus system 1219.

Figure 13:
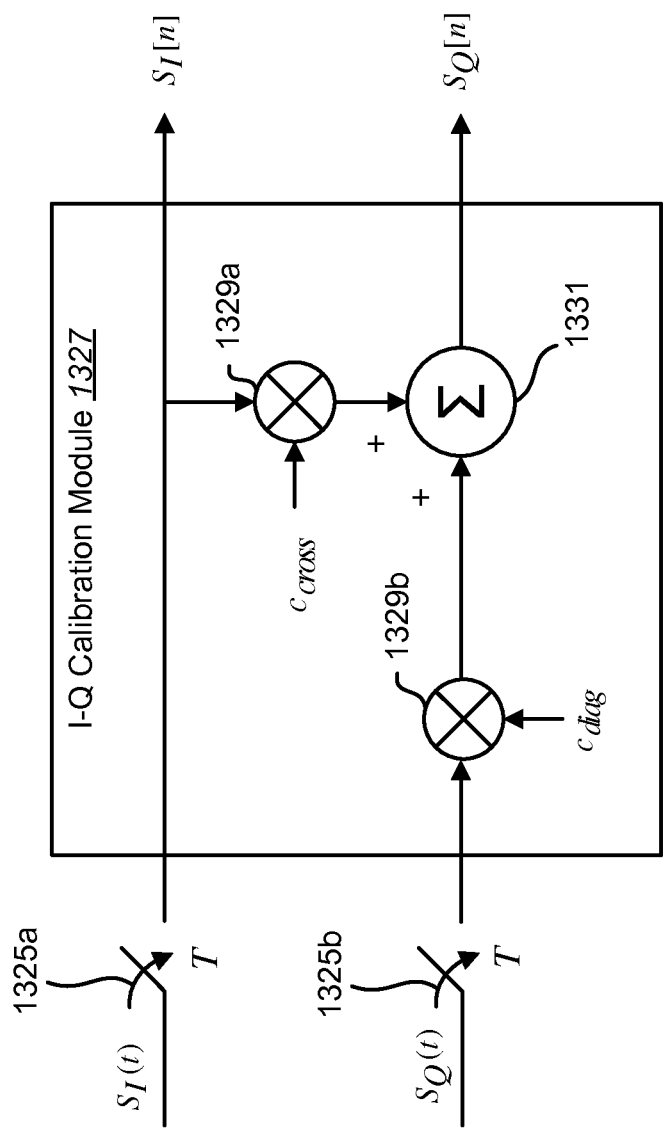
FIG. 13 is a block diagram illustrating one configuration for an I-Q imbalance calibration module.

FIG. 13 is a block diagram illustrating one configuration for an I-Q imbalance calibration module 1327. The I-Q imbalance calibration module 1327 may be included in a receiver 108 (e.g., the second receiver 108b as described above in connection with FIG. 1). The receiver 108 may determine a gain imbalance ($\alpha_R$) and a phase imbalance ($\theta_R$). This may be accomplished as described above in connection with FIG. 8. The receiver 108 may compute the I-Q correction coefficients $c_{cross}$ and $c_{diag}$, as given by Equation (15).

$$c_{cross} = -\tan(\theta_R) \qquad (15)$$

$$c_{diag} = \frac{1}{\alpha_R \cos(\theta_R)}$$

An in-phase component ($s_I(t)$) and a quadrature component ($s_Q(t)$) may be split in a splitter 1325a,b. The splitter 1325a,b may be a 3 dB splitter that splits the RF signal equally on the I branch and the Q branch. The I branch output of the splitter 1325a may be the in-phase baseband signal ($s_I[n]$). The in-phase baseband signal ($s_I[n]$) may be mixed with $C_{cross}$ in a mixer 1329a. The Q branch output of the splitter 1325b may be mixed with $c_{diag}$ in mixer 1329b. The outputs of the mixers 1329a,b may be combined using an adder 1331 to produce the I-Q corrected quadrature baseband signal ($s_Q[n]$).

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refer to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 2 and 9, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for in-phase-quadrature (I-Q) imbalance calibration, comprising:
   transmitting a signal by a first transmitter in a first system, the signal comprising a constant value;
   receiving the signal at a second receiver in a second system, wherein the first system and the second system are included in a same wireless communication device, and wherein the first system and the second system are different types of wireless systems; and
   estimating an I-Q imbalance for the second receiver based on the received signals, wherein estimating the I-Q imbalance comprises: measuring power on an in-phase branch and a quadrature branch, and
   measuring a cross-correlation between the in-phase branch and the quadrature branch, wherein a switch is configured to selectively couple the first transmitter in the first system to the second receiver in the second system during I-Q imbalance calibration, and
   wherein a first adder combines a transmit path of the first system and a transmit path of the second system, and a second adder is coupled to a receive path of the first system and a receive path of the second system, wherein the switch is coupled between the first adder and the second adder.

2. The method of claim 1, wherein estimating the I-Q imbalance further comprises:
   determining a gain imbalance of the second receiver based on the power on the in-phase branch and the power on the quadrature branch; and determining a phase imbalance of the second receiver based on the cross-correlation between the in-phase branch and the quadrature branch and the power on the in-phase branch.

3. The method of claim 1, further comprising:
   transmitting a digital tone by a second transmitter in the second system; receiving the digital tone at the second receiver in the second system; and
   estimating the I-Q imbalance for the second transmitter in the second system based on the received digital tone.

4. The method of claim 1, wherein the first system is a WiFi system, a Bluetooth system, or a Long-Term Evolution system, and the second system is a WiFi system, a Bluetooth system, or a Long-Term Evolution system.

5. The method of claim 1, wherein the signal further comprises an in-phase component set to a first constant value and a quadrature component set to a second constant value.

6. The method of claim 1, wherein the first system and the second system are on a combined system on chip.

7. A method for in-phase-quadrature (I-Q) imbalance calibration, comprising:
   setting a first synthesizer in a first system to a first frequency, the first system comprising a first transmitter and a first receiver;
   setting a second synthesizer in a second system to a second frequency, wherein the first frequency and the second frequency differ by a third frequency, the second system comprising a second transmitter and a second receiver, wherein the first system and the second system are included in a same wireless communication device;

transmitting a signal by the first transmitter in the first system, the signal comprising a constant value;

receiving the signal at the second receiver in the second system; and estimating an I-Q imbalance for the second receiver based on the received signal, wherein estimating the I-Q imbalance comprises:

determining a gain imbalance of the second receiver based on power measured on an in-phase branch and power measured on a quadrature branch, and determining a phase imbalance of the second receiver based on a cross-correlation measured between the in-phase branch and the quadrature branch, and the power measured on the in-phase branch.

8. The method of claim 7, wherein the first frequency and the second frequency are within a valid bandwidth range for the second receiver.

9. A wireless communication device configured for in-phase-quadrature (I-Q) imbalance calibration, comprising:
a processor;
memory in electronic communication with the processor;
instructions stored in the memory, the instructions being executable by the processor to: transmit a signal by a first transmitter in a first system in the wireless communication device, the signal comprising a constant value;
receive the signal at a second receiver in a second system in the wireless communication device, wherein the first system and the second system are different types of wireless systems; and
estimate an I-Q imbalance for the second receiver based on the received signal, wherein the instructions executable to estimate the I-Q imbalance comprise instructions executable to:
measure power on an in-phase branch and a quadrature branch, and
measure a cross-correlation between the in-phase branch and the quadrature branch;
a switch configured to selectively couple the first transmitter in the first system to the second receiver in the second system during I-Q imbalance calibration;
a first adder configured to combine a transmit path of the first system and a transmit path of the second system; and
a second adder coupled to a receive path of the first system and a receive path of the second system, wherein the switch is coupled between the first adder and the second adder.

10. The wireless communication device of claim 9, wherein the instructions executable to estimate the I-Q imbalance further comprise instructions executable to:
determine a gain imbalance of the second receiver based on the power on the in-phase branch and the power on the quadrature branch; and determine a phase imbalance of the second receiver based on the cross-correlation between the in-phase branch and the quadrature branch and the power on the in-phase branch.

11. The wireless communication device of claim 9, wherein the instructions are further executable to:
transmit a digital tone by a second transmitter in the second system; receive the digital tone at the second receiver in the second system; and estimate the I-Q imbalance for the second transmitter in the second system based on the received digital tone.

12. The wireless communication device of claim 9, wherein the first system is a WiFi system, a Bluetooth system, or a Long-Term Evolution system, and the second system is a WiFi system, a Bluetooth system, or a Long-Term Evolution system.

13. The wireless communication device of claim 9, wherein the signal further comprises an in-phase component set to a first constant value and a quadrature component set to a second constant value.

14. The wireless communication device of claim 9, wherein the first system and the second system are on a combined system on chip.

15. A wireless communication device configured for in-phase-quadrature (I-Q) imbalance calibration, comprising:
a processor;
memory in electronic communication with the processor; and
instructions stored in the memory, the instructions being executable by the processor to: set a first synthesizer in a first system in the wireless communication device to a first frequency, the first system comprising a first transmitter and a first receiver;
set a second synthesizer in a second system in the wireless communication device to a second frequency, wherein the first frequency and the second frequency differ by a third frequency, the second system comprising a second transmitter and a second receiver;
transmit a signal by the first transmitter in the first system, the signal comprising a constant value;
receive the signal at the second receiver in the second system; and estimate an I-Q imbalance for the second receiver based on the received signal, wherein the instructions executable to estimate the I-Q imbalance comprise instructions executable to:
determine a gain imbalance of the second receiver based on power measured on an in-phase branch and power measured on a quadrature branch, and
determine a phase imbalance of the second receiver based on a cross-correlation measured between the in-phase branch and the quadrature branch, and the power measured on the in-phase branch.

16. The wireless communication device of claim 15, wherein the first frequency and the second frequency are within a valid bandwidth range for the second receiver.

17. A wireless communication device configured for in-phase-quadrature (I-Q) imbalance calibration, comprising:
means for transmitting a signal by a first transmitter in a first system of the wireless communication device, the signal comprising a constant value;
means for receiving the signal at a second receiver in a second system of the wireless communication device, wherein the first system and the second system are different types of wireless systems;
means for estimating an I-Q imbalance for the second receiver based on the received signal, wherein the means for estimating the I-Q imbalance comprise:
means for measuring power on an in-phase branch and a quadrature branch, and means for measuring a cross-correlation between the in-phase branch and the quadrature branch;
means for selectively coupling the first transmitter in the first system to the second receiver in the second system during I-Q imbalance calibration;

first means for adding coupled to a transmit path of the first system and a transmit path of the second system; and second means for adding coupled to a receive path of the first system and a receive path of the second system, wherein the means for selectively coupling is coupled between the first means for adding and the second means for adding.

18. The wireless communication device of claim 17, wherein the means for estimating the I-Q imbalance further comprise:

means for determining a gain imbalance of the second receiver based on the power on the in-phase branch and the power on the quadrature branch; and means for determining a phase imbalance of the second receiver based on the cross-correlation between the in-phase branch and the quadrature branch and the power on the in-phase branch.

19. The wireless communication device of claim 17, further comprising: means for setting a first synthesizer in the first system to a first frequency; and means for setting a second synthesizer in the second system to a second frequency, wherein the first frequency and the second frequency differ by a third frequency.

20. The wireless communication device of claim 17, further comprising: means for transmitting a digital tone by a second transmitter in the second system; means for receiving the digital tone at the second receiver in the second system; and means for estimating the I-Q imbalance for the second transmitter in the second system based on the received digital tone.

21. A computer-program product for in-phase-quadrature (I-Q) imbalance calibration, the computer-program product comprising a non-transitory computer-readable medium having instructions thereon, the instructions comprising:

code for causing a wireless communication device to transmit a signal by a first transmitter in a first system, the signal comprising a constant value;

code for causing the wireless communication device to receive the signal at a second receiver in a second system, wherein the first system and the second system are included in the wireless communication device, and wherein the first system and the second system are different types of wireless systems; and code for causing the wireless communication device to estimate an I-Q imbalance for the second receiver based on the received signal, wherein the code for causing the wireless communication device to estimate the I-Q imbalance comprises:

code for causing the wireless communication device to measure power on an in-phase branch and a quadrature branch, code for causing the wireless communication device to measure a cross-correlation between the in-phase branch and the quadrature branch, code for causing the wireless communication device to determine a gain imbalance of the second receiver based on the power on the in-phase branch and the power on the quadrature branch, and code for causing the wireless communication device to determine a phase imbalance of the second receiver based on the cross-correlation between the in-phase branch and the quadrature branch and the power on the in-phase branch.

22. The computer-program product of claim 21, further comprising:

code for causing the wireless communication device to set a first synthesizer in the first system to a first frequency; and code for causing the wireless communication device to set a second synthesizer in the second system to a second frequency, wherein the first frequency and the second frequency differ by a third frequency.

23. The computer-program product of claim 21, further comprising:

code for causing the wireless communication device to transmit a digital tone by a second transmitter in the second system;

code for causing the wireless communication device to receive the digital tone at the second receiver in the second system; and code for causing the wireless communication device to estimate the I-Q imbalance for the second transmitter in the second system based on the received digital tone.

* * * * *